(12) United States Patent
Haraguchi et al.

(10) Patent No.: US 12,340,838 B2
(45) Date of Patent: Jun. 24, 2025

(54) DRIVE CIRCUIT WITH IMPROVED TIMING MARGIN FOR MEMORY DEVICE

(71) Applicant: Taiwan Semiconductor Manufacturing Company, Ltd., Hsinchu (TW)

(72) Inventors: Masaru Haraguchi, Hsinchu (TW); Yoshisato Yokoyama, Hsinchu (TW); Yorinobu Fujino, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 160 days.

(21) Appl. No.: 18/103,364

(22) Filed: Jan. 30, 2023

(65) Prior Publication Data

US 2024/0021241 A1  Jan. 18, 2024

Related U.S. Application Data

(60) Provisional application No. 63/388,779, filed on Jul. 13, 2022.

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
CPC ..... G11C 11/419; G11C 2207/12; G11C 7/12; G11C 11/413; G11C 11/412

(Continued)

(56) References Cited

U.S. PATENT DOCUMENTS 7,839,704 B2 * 11/2010 Murata ................. G11C 11/413
365/189.16
9,171,589 B2  10/2015 Kim et al.
(Continued)

FOREIGN PATENT DOCUMENTS

| KR | 10-2003-0002062 A | 1/2003 |
|---|---|---|
| KR | 10-2010-0022045 A | 2/2010 |
| TW | 594783 B | 6/2004 |

OTHER PUBLICATIONS

Office Action issued in connection with Taiwan Appl. No. 112124967 dated Jun. 3, 2024.

(Continued)

*Primary Examiner* — Tha-O H Bui
(74) *Attorney, Agent, or Firm* — FOLEY & LARDNER LLP

(57) ABSTRACT

Disclosed herein are related to a memory device. In one aspect, the memory device includes a drive circuit coupled to a first line and a second line. In one aspect, the drive circuit is configured to apply, according to a first control signal having a first state, a data signal to either one of the first line or the second line to write data at a memory cell. In one aspect, the memory device includes a pre-charge circuit configured to set, according to a second control signal having a second state, voltages at the first line and the second line to a predetermined voltage level. In one aspect, the memory device includes an equalizer configured to electrically decouple the first line from the second line, according to the first control signal having the first state and the second control signal having the second state.

20 Claims, 17 Drawing Sheets

(58) Field of Classification Search
USPC .......................................................... 365/154
See application file for complete search history.

(56) References Cited

U.S. PATENT DOCUMENTS

| | | |
|---|---|---|
| 2011/0188287 A1 | 8/2011 | Kim |
| 2012/0314486 A1* | 12/2012 | Yoshimoto ............ G11C 11/419 |
| | | 365/156 |
| 2021/0104509 A1 | 4/2021 | Lu |

OTHER PUBLICATIONS

Office Action issued in connection with Korean Appl. No. 10-2023-0089836 dated Aug. 12, 2024.

* cited by examiner

DRIVE CIRCUIT WITH IMPROVED TIMING MARGIN FOR MEMORY DEVICE

CROSS-REFERENCE TO RELATED APPLICATION

This application claims priority to and the benefit of U.S. Provisional Patent Application No. 63/388,779, filed on Jul. 13, 2022, which is incorporated by reference in its entirety.

BACKGROUND

Developments in electronic devices, such as computers, portable devices, smart phones, internet of thing (IoT) devices, etc., have prompted increased demands for memory devices. In general, memory devices may be volatile memory devices or non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
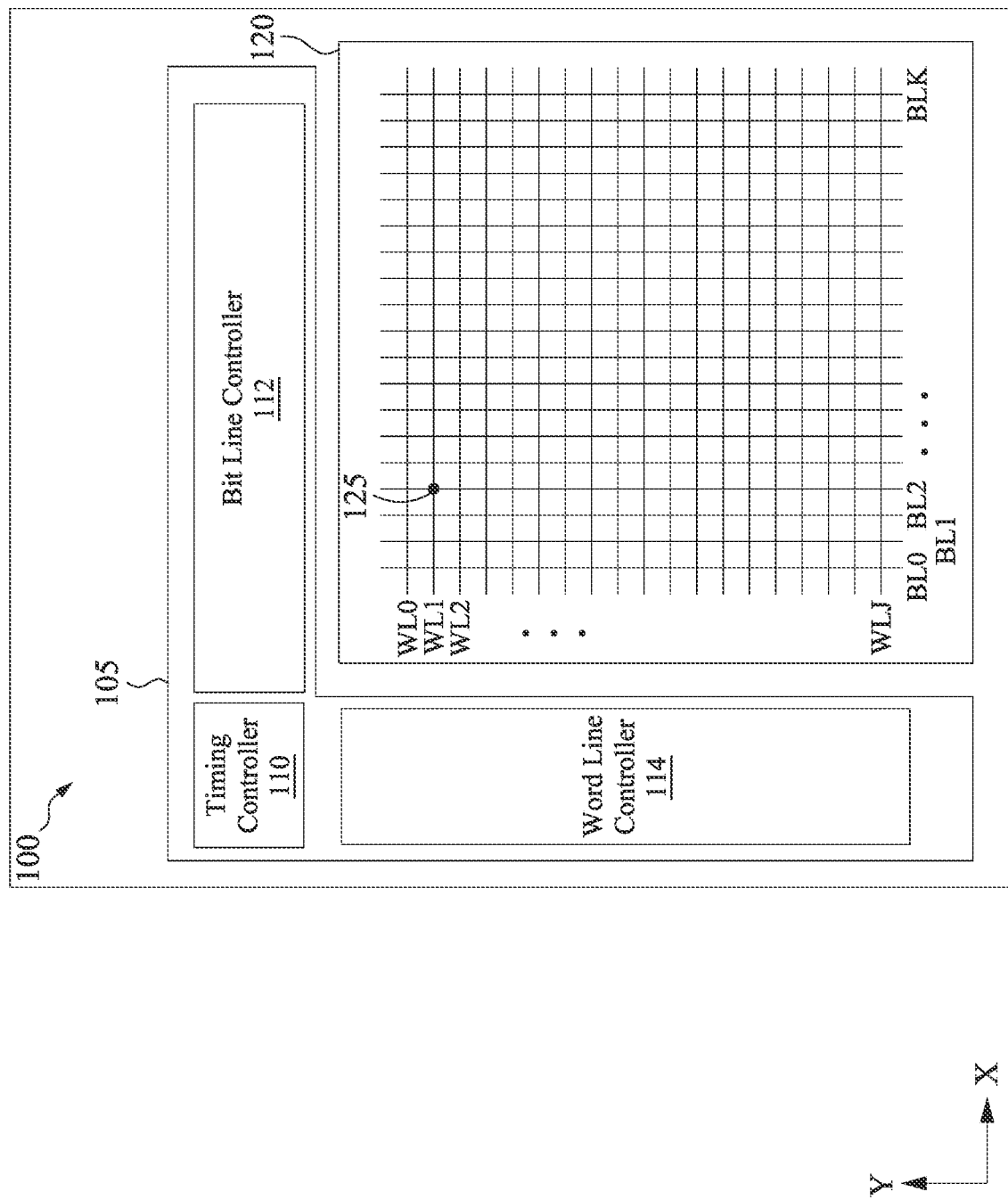
FIG. 1 illustrates a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are generally related to improving a timing margin of writing data at a memory cell. In various embodiments of the present disclosure, a memory device, as disclosed herein, includes a drive circuit coupled to a first line and a second line. The first line may be a first bit line (e.g., BL) coupled to a memory cell, and the second line may be a second bit line (e.g., BLB) coupled to the same memory cell. The drive circuit may apply a data signal to either one of the first bit line or the second bit line to write data at a memory cell. The memory device may include a pre-charge circuit configured to set voltages at the first bit line and the second bit line to a predetermined voltage level. The memory device may further include an equalizer configured to selectively couple or decouple the first bit line and the second bit line. The drive circuit, the pre-charge circuit, and the equalizer can be configured or operated to improve timing margin of writing data at a memory cell.

In general, writing data at a memory cell is performed through two phases: a pre-charging phase, and a writing phase. In the pre-charging phase, the equalizer of the disclosed memory device may be enabled to electrically couple the first bit line to the second bit line, in response to a first control signal having a first state and a second control signal having a second state. In the pre-charging phase, the pre-charge circuit of the disclosed memory device may set a first voltage at the first bit line and a second voltage at the second bit line to the predetermined voltage level while the equalizer is enabled, in response to the first control signal having the first state and the second control signal having the second state. When transitioning to the writing phase or before transitioning to the writing phase, the equalizer and the pre-charge circuit may be disabled to electrically decouple the first bit line from the second bit line, in response to the first control signal having a third state and the second control signal having the second state. In the writing phase, a data signal corresponding to data to write can be applied to the memory cell, in response to the first control signal having the third state and the second control signal having a fourth state.

Advantageously, timing margin of writing data at a memory cell of the disclosed memory device can be improved. In one implementation, the drive circuit can be controlled or operated by the first control signal, and the pre-charge circuit and the equalizer can be controlled or operated by the second control signal. As such, in the pre-charging phase, the drive circuit can be disabled, in response to the first control signal having the first state. Moreover, in the pre-charging phase, the equalizer can be enabled to electrically couple the first bit line and the second bit line, and the pre-charge circuit can be enabled to set voltages at the first bit line and the second bit line to a predetermined voltage level, according to the second control signal having a second state. Next in the writing phase, the drive circuit can be enabled to apply a data signal for writing data at a memory cell, in response to the first control signal having the third state. Moreover, in the writing phase, the equalizer can be disabled to electrically decouple the first bit line from the second bit line, and the pre-charge circuit may be disabled, such that the pre-charge circuit may not set voltages at the first bit line and the second bit line to the predetermined voltage level, according to the second control signal having the fourth state. In various embodiments disclosed herein, the pre-charge circuit and the equalizer can be automatically disabled, when the drive circuit is enabled in response to the first control signal having the third state. Accordingly, a large timing margin between the first control signal and the second control signal can be obviated, because it can be assured that, when the drive circuit is enabled, the pre-charge circuit and the equalizer can be automatically disabled (e.g., which significantly avoids unintended current flow). As such, a relatively large timing margin may no longer be needed (to ensure correct writing operation and avoid unintended current), which can in turn improve the speed of writing data at the memory cell.

In some embodiments, one or more components can be embodied as one or more transistors. The transistors in this disclosure are shown to have a certain type (N-type or P-type), but embodiments are not limited thereto. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel. In one aspect, a transistor includes a source electrode, a drain electrode and a gate electrode. A source electrode and a drain electrode can be interchangeable, according to voltages applied to the source electrode and the drain electrode. Hence, a source electrode and a drain electrode can be each referred to as a source/drain electrode herein.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two- or three-dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. In one approach, to write data at a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

Figure 2:
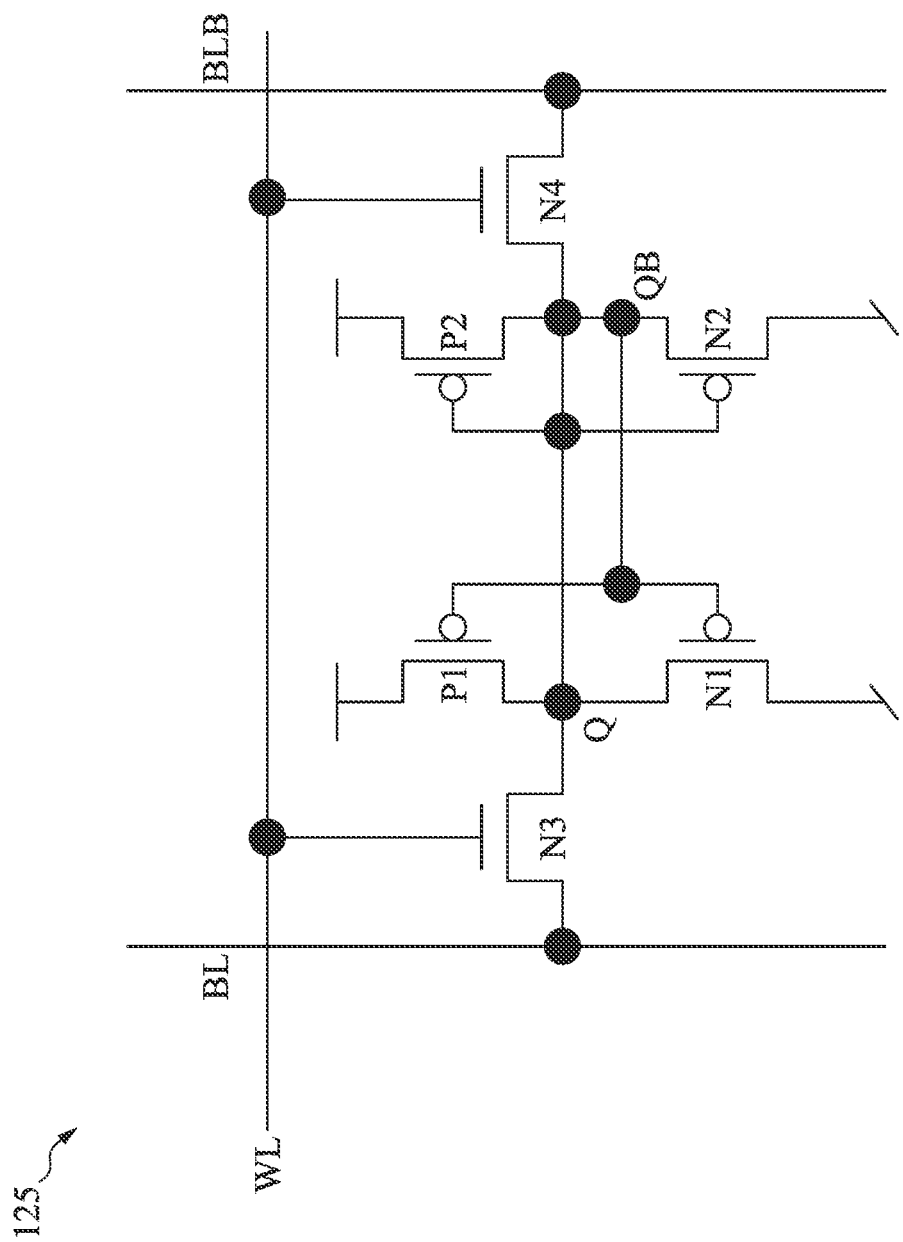
FIG. 2 is a schematic diagram of a static random access memory (SRAM) cell, in accordance with one embodiment.

FIG. 2 is a diagram of a SRAM cell 125, in accordance with one embodiment. In some embodiments, the SRAM cell 125 includes N-type transistors N1, N2, N3, N4 and P-type transistors P1, P2. The N-type transistors N1, N2, N3, N4 may be N-type metal-oxide-semiconductor field-effect transistors (MOSFET) or N-type fin field-effect transistors (FinFET). The P-type transistors P1, P2 may be P-type MOSFET or P-type FinFET. These components may operate together to store a bit. In other embodiments, the SRAM cell 125 includes more, fewer, or different components than shown in FIG. 2.

In one configuration, the N-type transistors N3, N4 include gate electrodes coupled to a word line WL. In one configuration, a drain electrode of the N-type transistor N3 is coupled to a bit line BL, and a source electrode of the N-type transistor N3 is coupled to a port Q. In one configuration, a drain electrode of the N-type transistor N4 is coupled to a bit line BLB, and a source electrode of the N-type transistor N4 is coupled to a port QB. In one aspect, the N-type transistors N3, N4 operate as electrical switches. The N-type transistors N3, N4 may allow the bit line BL to electrically couple to or decouple from the port Q and allow the bit line BLB to electrically couple to or decouple from the port QB, according to a voltage applied to the word line WL. For example, according to a supply voltage VDD (or 1V) corresponding to a high state (or logic value '1') applied to the word line WL, the N-type transistor N3 is enabled to electrically couple the bit line BL to the port Q and the N-type transistor N4 is enabled to electrically couple the bit line BLB to the port QB. For another example, according to a ground voltage VSS (or 0V) corresponding to a low state (or logic value '0') applied to the word line WL, the N-type transistor N3 is disabled to electrically decouple the bit line BL from the port Q and the N-type transistor N4 is disabled to electrically decouple the bit line BLB from the port QB.

In one configuration, the N-type transistor N1 includes a source electrode coupled to a first supply voltage rail supplying the ground voltage VSS or 0V, a gate electrode coupled to the port QB, and a drain electrode coupled to the port Q. In one configuration, the P-type transistor P1 includes a source electrode coupled to a second supply voltage rail supplying the supply voltage VDD, a gate electrode coupled to the port QB, and a drain electrode coupled to the port Q. In one configuration, the N-type transistor N2 includes a source electrode coupled to the first supply voltage rail supplying the ground voltage VSS or 0V, a gate electrode coupled to the port Q, and a drain electrode coupled to the port QB. In one configuration, the P-type transistor P2 includes a source electrode coupled to the second supply voltage rail supplying the supply voltage VDD, a gate electrode coupled to the port Q, and a drain electrode coupled to the port QB. In this configuration, the N-type transistor N1 and the P-type transistor P1 operate as an inverter, and the N-type transistor N2 and the P-type transistor P2 operate as an inverter, such that two inverters form cross-coupled inverters. In one aspect, the cross-coupled inverters may sense and amplify a difference in voltages at the ports Q, QB. When writing data, the cross-coupled inverters may sense voltages at the ports Q, QB provided through the N-type transistors N3, N4 and amplify a difference in voltages at the bit lines BL, BLB. For example, the cross-coupled inverters sense a voltage 0.5 V at the port Q and a voltage 0.4V at the port QB, and amplify a difference in the voltages at the ports Q, QB through a positive feedback (or a regenerative feedback) such that the voltage at the port Q becomes the supply voltage VDD (e.g., 1V) and the voltage at the port QB becomes the ground voltage VSS (e.g. 0V). The amplified voltages at the ports Q, QB may be provided to the bit lines BL, BLB through the N-type transistors N3, N4, respectively for reading.

Figure 3:
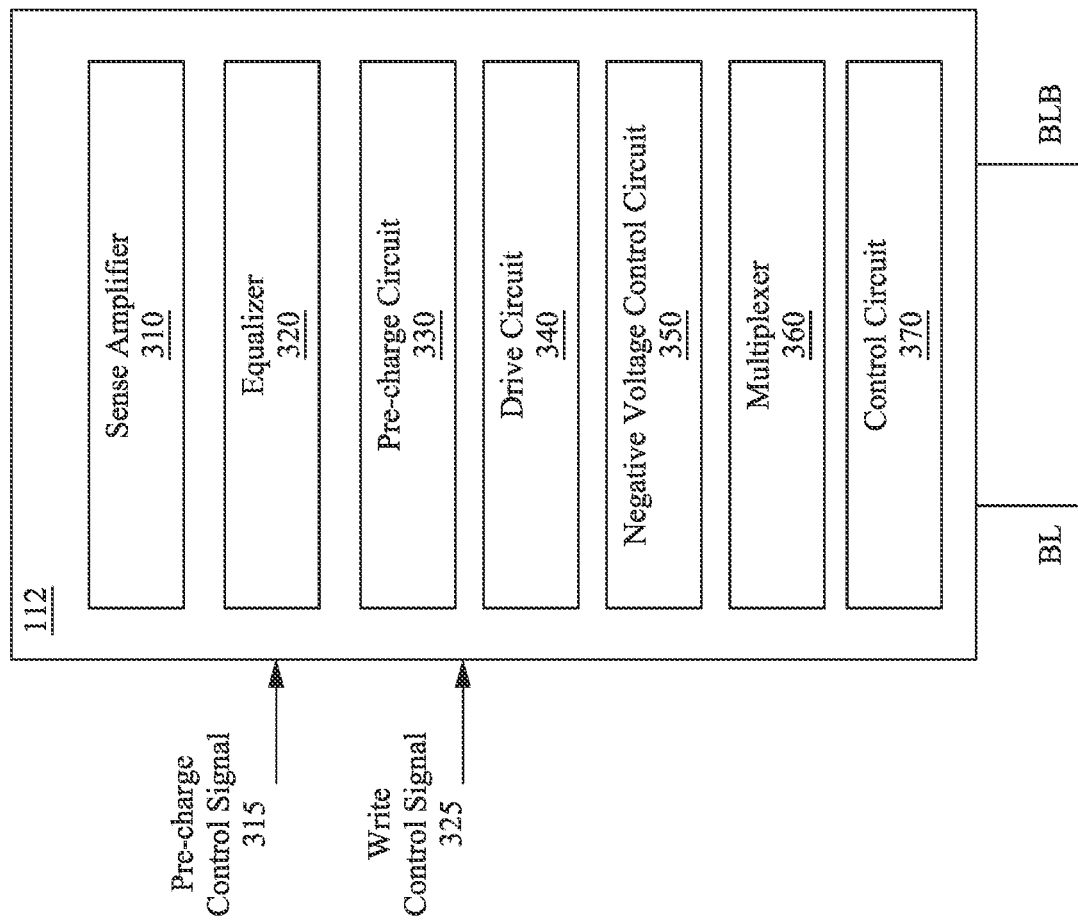
FIG. 3 is a schematic diagram of a bit line controller, in accordance with one embodiment.

FIG. 3 is a schematic diagram of a bit line controller 112, in accordance with one embodiment. In some embodiments, the bit line controller 112 includes a sense amplifier 310, an equalizer 320, a pre-charge circuit 330, a drive circuit 340, a negative voltage control circuit 350, a multiplexer 360, and a control circuit 370. These components may operate together to apply data signals to one or more memory cells 125 through bit lines BL, BLB to write data at the one or more memory cells 125, and/or sense signals from the one or more memory cells 125 to read data stored by the one or more memory cells 125. In one aspect, the bit line controller 112 operates, according to a pre-charge control signal 315 and a write control signal 325. A pre-charge control signal 315 may be a signal indicating whether to pre-charge bit lines BL, BLB. A write control signal 325 may be a signal indicating whether to provide a data signal to the bit line BL, BLB to write data at the memory cell 125. The pre-charge control signal 315 and the write control signal 325 may be generated by the timing controller 110. In some embodiments, the bit line controller 112 includes more, fewer, or different components than shown in FIG. 3.

In some embodiments, the sense amplifier 310 is a circuit or a component that can receive signals from one or more memory cells 125 through the bit lines BL, BLB, and read or determine data stored by the one or more memory cells 125 according to the received signals. In some embodiments, the sense amplifier 310 is embodied as an operational amplifier or a comparator. In some embodiments, the sense amplifier 310 can be replaced by a different component that can perform the functions of the sense amplifier 310 described herein. In one configuration, the sense amplifier 310 is coupled to the bit lines BL, BLB. In this configuration, the sense amplifier 310 can receive the signals through the bit lines BL, BLB, and determine a data stored by one or more memory cells 125, according to the received signals. In one example, the signals received through the bit lines BL, BLB may be differential signals. The sense amplifier 310 may compare voltages at the bit lines BL, BLB, and determine a value stored by a memory cell 125, according to the comparison. For example, if the voltage at the bit line BL is higher than the voltage at the bit line BLB, then the sense amplifier 310 may determine that the memory cell 125 stores a value '1'. For example, if the voltage at the bit line BLB is higher than the voltage at the bit line BL, then the sense amplifier 310 may determine that the memory cell 125 stores a value '0'.

In some embodiments, the equalizer 320 is a circuit or a component that can selectively couple the bit lines BL, BLB. In some embodiments, the equalizer 320 is implemented as one or more switches or one or more transistors. In some embodiments, the equalizer 320 can be replaced by a different component that can perform the functions of the equalizer 320 described herein. In one configuration, the equalizer 320 is coupled to the bit lines BL, BLB. In some embodiments, the equalizer 320 can be controlled, according to the pre-charge control signal 315, or a combination of the pre-charge control signal 315 and the write control signal

325. For example, the equalizer 320 may be enabled to electrically couple the bit line BL to the bit line BLB, in response to i) the pre-charge control signal 315 having a first voltage (e.g., VDD or 1V) and ii) the write control signal 325 having the first voltage (e.g., VDD or 1V). For example, the equalizer 320 may be disabled to electrically decouple the bit line BL from the bit line BLB, in response to i) the pre-charge control signal 315 having a second voltage (e.g., VSS or 0V) or ii) the write control signal 325 having the second voltage (e.g., VSS or 0V).

In some embodiments, the pre-charge circuit 330 is a circuit or a component that can set or pre-charge voltages at bit lines BL, BLB. In some embodiments, the pre-charge circuit 330 is implemented as one or more switches or one or more transistors. In some embodiments, the pre-charge circuit 330 can be replaced by a different component that can perform the functions of the pre-charge circuit 330 described herein. In one configuration, the pre-charge circuit 330 is coupled to the bit lines BL, BLB. In some embodiments, the pre-charge circuit 330 can be controlled, according to the pre-charge control signal 315, or a combination of the pre-charge control signal 315 and the write control signal 325. For example, the pre-charge circuit 330 may be enabled to set or pre-charge voltages at the bit lines BL, BLB to a predetermined voltage level (e.g., VDD or 1V), in response to i) the pre-charge control signal 315 having the first voltage (e.g., VDD or 1V) and ii) the write control signal 325 having the first voltage (e.g., VDD or 1V). For example, the pre-charge circuit 330 may be disabled, such that the pre-charge circuit 330 may not set or pre-charge voltages at the bit lines BL, BLB, in response to i) the pre-charge control signal 315 having the second voltage (e.g., VSS or 0V) or ii) the write control signal 325 having the second voltage (e.g., VSS or 0V).

In some embodiments, the drive circuit 340 is a circuit or a component that can apply data signals to bit lines BL, BLB. Data signals may correspond to or indicate data to write. In one aspect, data signals may be differential signals having opposite phases with each other. For example, a data signal at a bit line BL and a data signal at a bit line BLB may have opposite phases with each other to represent one bit data. In some embodiments, the drive circuit 340 is implemented as one or more switches or one or more transistors. In one configuration, the drive circuit 340 is coupled to the bit lines BL, BLB. In some embodiments, the drive circuit 340 can be replaced by a different component that can perform the functions of the drive circuit 340 described herein. In some embodiments, the drive circuit 340 can be controlled, according to the write control signal 325. For example, the drive circuit 340 may be disabled, such that the drive circuit 340 may not apply data signals at the bit lines BL, BLB, in response to the write control signal 325 having the first voltage (e.g., VDD or 1V). For example, the drive circuit 340 may be enabled to apply data signals at the bit lines BL, BLB, in response to the write control signal 325 having the second voltage (e.g., VSS or 0V).

In some embodiments, the negative voltage control circuit 350 is a circuit or a component that can generate a negative voltage, and provide the negative voltage to the drive circuit 340. In some embodiments, the negative voltage control circuit 350 can be replaced by a different component that can perform the functions of the negative voltage control circuit 350 described herein. In one configuration, the negative voltage control circuit 350 is coupled to the drive circuit 340. In this configuration, the negative voltage control circuit 350 may provide a negative voltage to write data or assist writing data at one or more memory cells 125. In one example, when the drive circuit 340 applies data signals to write data, the negative voltage control circuit 350 may provide a negative voltage below a ground voltage (or 0V) to the drive circuit 340. The drive circuit 340 may generate a data signal based on or having the negative voltage, and apply the data signal having the negative voltage to the one or more memory cells 125. By applying the data signal based on or having the negative voltage, the speed of writing operation can be improved.

In one aspect, the control circuit 370 is a circuit or a component that can configure or operate the equalizer 320, the pre-charge circuit 330, and the drive circuit 340, according to the pre-charge control signal 315 and the write control signal 325. In some embodiments, the control circuit 370 is embodied as logic circuits. In some embodiments, the control circuit 370 can be replaced by a different component that can perform the functions of the control circuit 370 described herein. In one configuration, the control circuit 370 is coupled to the equalizer 320, the pre-charge circuit 330, and the drive circuit 340. In one aspect, the control circuit 370 can receive the pre-charge control signal 315 and the write control signal 325, and process the pre-charge control signal 315 and the write control signal 325 for operating the equalizer 320, the pre-charge circuit 330, and/or the drive circuit 340. In one implementation, the drive circuit 340 can be controlled or operated by the write control signal 325, and the pre-charge circuit 330 and the equalizer 320 can be controlled or operated by the pre-charge control signal 315, irrespective of the write control signal 325. However, such implementation may be subject to a strict timing requirement between the pre-charge control signal 315 and the write control signal 325. For example, if the drive circuit 340 is enabled while the equalizer 320 and the pre-charge circuit 330 are enabled, an unintended current can flow to increase power consumption and may cause the memory cell 125 to store incorrect data. To ensure the correct writing operation and avoid the unintended current flow, a large timing margin between the pre-charge control signal 315 and the write control signal 325 may be provided. However, such large timing margin may reduce or degrade the speed of writing data at the memory cell 125. In various embodiments disclosed herein, the control circuit 370 can automatically disable the equalizer 320 and the pre-charge circuit 330, if the drive circuit 340 is enabled, in response to the write control signal 325. By automatically disabling the equalizer 320 and the pre-charge circuit 330, when the drive circuit 340 is enabled, a large timing margin between the pre-charge control signal 315 and the write control signal 325 can be obviated and the speed of writing data at the memory cell 125 can be improved. Various examples of operating the equalizer 320, the pre-charge circuit 330, and the drive circuit 340 based on the pre-charge control signal 315 and the write control signal 325 are provided below with respect to FIGS. 4A-12.

In some embodiments, the multiplexer 360 is a circuit or a component that can selectively couple the sense amplifier 310 or the drive circuit 340 to the bit lines BL, BLB. In some embodiments, the multiplexer 360 is implemented as one or more switches or one or more transistors. In some embodiments, the multiplexer 360 can be replaced by a different component that can perform the functions of the multiplexer 360 described herein. In one configuration, the multiplexer 360 is coupled to the bit lines BL, BLB, the sense amplifier 310, and the drive circuit 340. In this configuration, the multiplexer 360 can selectively couple bit lines BL, BLB in different columns of memory cells 125 to the drive circuit 340 or the sense amplifier 310. For example, to write data at a memory cell 125, the multiplexer 360 may electrically couple bit lines BL, BLB of a column of memory cells 125 to the drive circuit 340 and electrically decouple the bit lines BL, BLB of the column of memory cells 125 from the sense amplifier 310. For example, to read data stored by a memory cell 125, the multiplexer 360 may electrically couple bit lines BL, BLB of a column of memory cells 125 to the sense amplifier 310 and electrically decouple the bit lines BL, BLB of the column of memory cells 125 from the drive circuit 340.

Figure 4A:
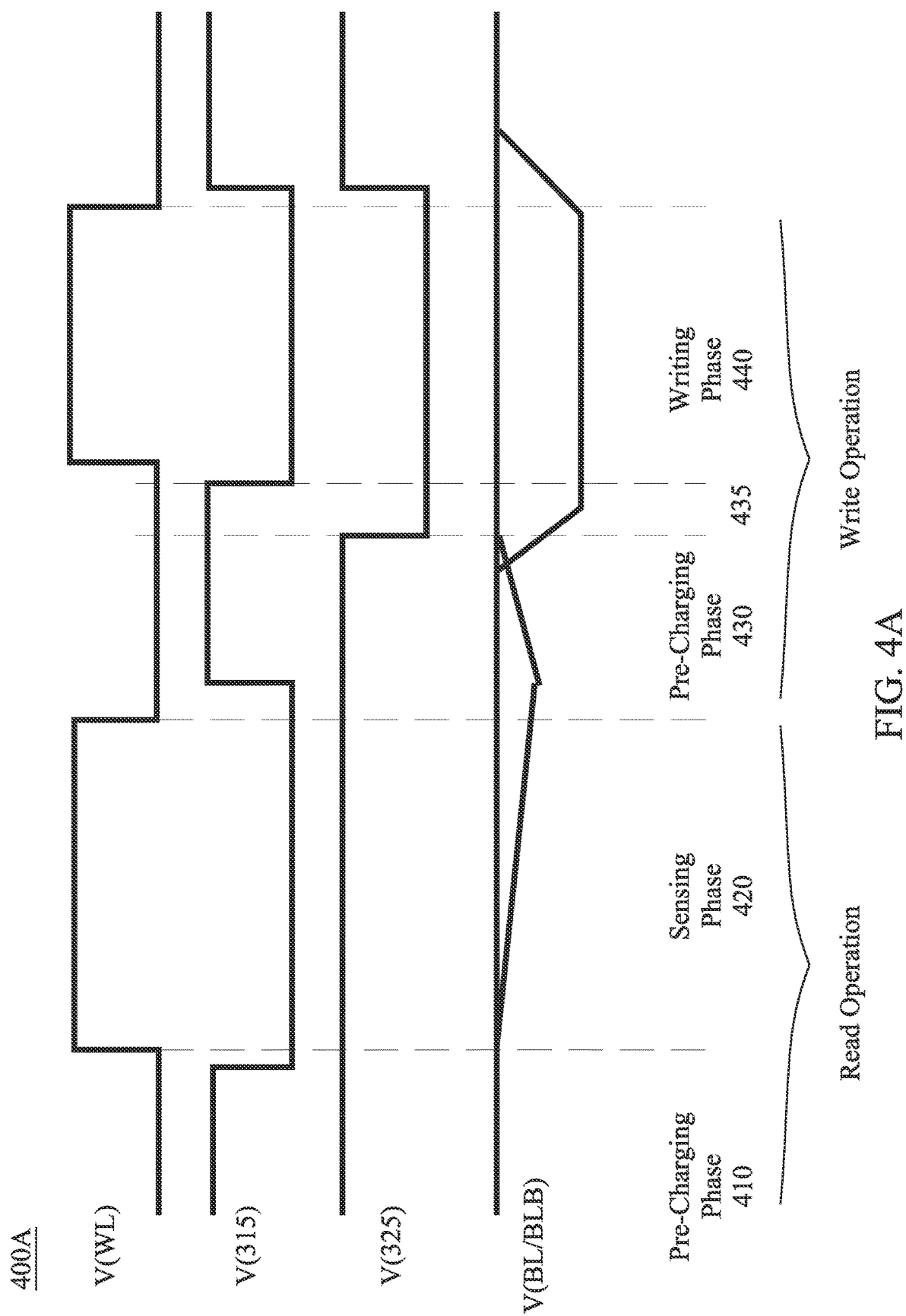
FIG. 4A is a timing diagram showing an operation of a memory device with an improved timing margin, in accordance with one embodiment.

FIG. 4A is a timing diagram 400A showing an operation of a memory device 100 with an improved timing margin, in accordance with one embodiment. In some embodiments, the timing diagram 400A includes voltage waveforms V(WL), V(315), V(325), and V(BL/BLB). The waveform V(WL) may show a voltage at a word line WL coupled to a memory cell 125. The waveform V(315) may show a voltage of the pre-charge control signal 315. The waveform V(325) may show a voltage of the write control signal 325. The waveform V(BL/BLB) may show voltages at bit lines BL, BLB coupled to the memory cell 125. In one aspect, the timing diagram 400A shows operations of the memory device 100 for reading data stored by a memory cell 125, and writing data to the memory cell 125.

In one aspect, a read operation is performed through two phases: a pre-charging phase 410 and a sensing phase 420. In the pre-charging phase 410, the word line controller 114 may generate a word line control signal at the word line WL to have a second voltage (e.g., VSS or 0V), such that transistors N3, N4 may be disabled. In the pre-charging phase 410, the timing controller 110 may generate the pre-charge control signal 315 having a first voltage (e.g., VDD or 1V), such that the equalizer 320 and the pre-charge circuit 330 can be enabled. In the pre-charging phase 410, the timing controller 110 may generate the write control signal 325 having a first voltage (e.g., VDD or 1V) to disable the drive circuit 340, such that the drive circuit 340 may not provide data signals for writing data. By disabling the transistors N3, N4 and the drive circuit 340, and enabling the pre-charge circuit 330 and the equalizer 320 in the pre-charging phase 410, the pre-charge circuit 330 can set or pre-charge voltages at the bit lines BL, BLB to the predetermined voltage level (e.g., VDD or 1V).

In the sensing phase 420, the word line controller 114 may generate a word line control signal at the word line WL having the first voltage (e.g., VDD or 1V), such that transistors N3, N4 may be enabled. In the sensing phase 420, the timing controller 110 may generate the pre-charge control signal 315 having a second voltage (e.g., VSS or 0V), such that the pre-charge circuit 330 and the equalizer 320 can be disabled and not set voltages at the bit lines BL, BLB to the predetermined voltage level (e.g., VDD or 1V). In the sensing phase 420, the timing controller 110 may generate the write control signal 325 having a first voltage (e.g., VDD or 1V) to disable the drive circuit 340, such that the drive circuit 340 may not provide data signals for writing data. By disabling the pre-charge circuit 330 and the drive circuit 340, and enabling the transistors N3, N4, the voltages at the bit lines BL, BLB can be changed, according to a data stored by the memory cell 125. For example, if the memory cell 125 stores a value '1', the voltage at the bit line BLB may decrease and may become lower than the voltage at the bit line BL. For example, if the memory cell 125 stores a value '0', the voltage at the bit line BL may decrease and may become lower than the voltage at the bit line BLB. The sense amplifier 310 may sense voltages at the bit lines BL, BLB in the sensing phase 420, and determine a data stored by the memory cell 125, according to the sensed voltages.

In one aspect, a write operation is performed through two phases: a pre-charging phase 430 and a writing phase 440. In one aspect, the pre-charging phase 430 is similar to the pre-charging phase 410. Thus, detailed description of duplicated portion thereof is omitted herein for the sake of brevity.

In some embodiments, a transitioning phase 435 can be provided between the pre-charging phase 430 and the writing phase 440, optionally. For example, the transitioning phase 435 may be omitted when the pre-charge control signal 315 has a second voltage (e.g., VSS or 0V), and the write control signal 325 has the first voltage (e.g., VDD or 1V) (or when the falling edge of the pre-charge control signal 315 occurs before the falling edge of the write control signal 325), because the equalizer 320 and the pre-charge circuit 330 can be disabled, in response to the pre-charge control signal 315 having the second voltage (e.g., VSS or 0V). For example, the transitioning phase 435 may be provided when the pre-charge control signal 315 has the first voltage (e.g., VDD or 1V), and the write control signal 325 has a second voltage (e.g., VSS or 0V) (or when the falling edge of the write control signal 325 occurs before the falling edge of the pre-charge control signal 315). In the transitioning phase 435, in response to the write control signal 325 having the second voltage (e.g., VSS or 0V), the bit line controller 112 or the control circuit 370 may automatically disable the pre-charge circuit 330 and the equalizer 320, despite the pre-charge control signal 315 having the first voltage (e.g., VDD or 1V). In the transitioning phase 435, in response to the write control signal 325 having the second voltage (e.g., VSS or 0V), the drive circuit 340 can be enabled to apply data signals corresponding to data to write to bit lines BL, BLB. In the transitioning phase 435, the word line controller 114 may generate a word line control signal at the word line WL having the second voltage (e.g., VSS or 0V), such that transistors N3, N4 may be disabled. By automatically disabling the pre-charge circuit 330 and the equalizer 320 in response to the write control signal 325 having the second voltage (e.g., VSS or 0V) despite the pre-charge control signal 315 having the first voltage (e.g., VDD or 1V) in the transitioning phase 435, a large current through the pre-charge circuit 330, the equalizer 320 and the drive circuit 340 can be reduced or obviated. Hence, the write control signal 325 can be provided irrespective of the pre-charge control signal 315, such that a large timing margin between the write control signal 325 and the pre-charge control signal 315 can be reduced or omitted.

In the writing phase 440, the timing controller 110 may generate the write control signal 325 having the second voltage (e.g., VSS or 0V), such that the drive circuit 340 can be enabled to apply data signals corresponding to data to write to bit lines BL, BLB. In the writing phase 440, the timing controller 110 may generate the pre-charge control signal 315 having the second voltage (e.g., VSS or 0V), such that the pre-charge circuit 330 and the equalizer 320 can be disabled. In the writing phase 440, the word line controller 114 may generate a word line control signal at the word line WL having the first voltage (e.g., VDD or 1V), such that transistors N3, N4 may be enabled. Hence, in the writing phase 440, voltages at the bit lines BL, BLB can be applied to the memory cell 125 through the transistors N3, N4.

Figure 4B:
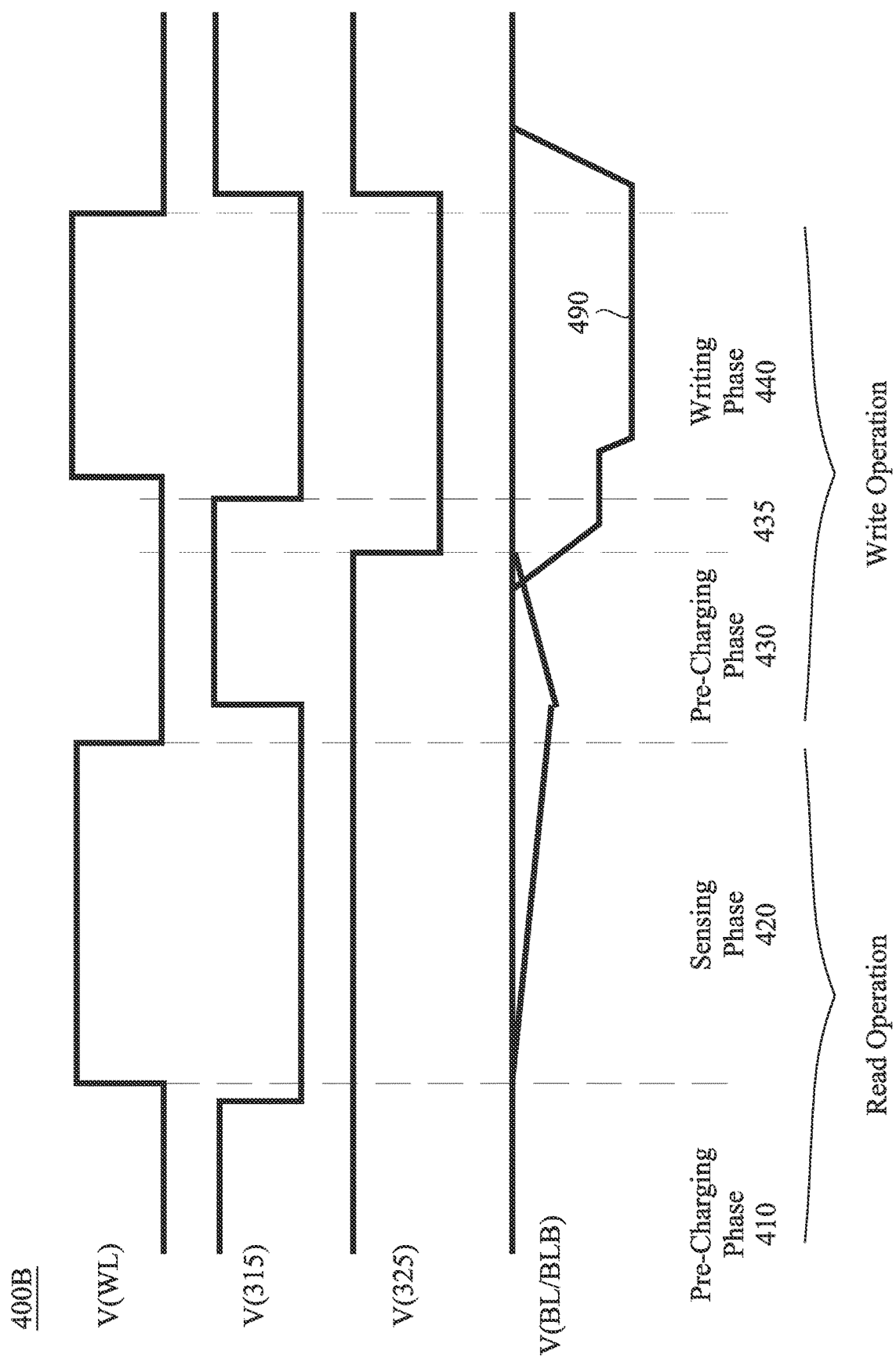
FIG. 4B is a timing diagram showing an operation of a memory device with an improved timing margin, in accordance with one embodiment.

FIG. 4B is a timing diagram 400B showing an operation of a memory device 100 with an improved timing margin, in accordance with one embodiment. The timing diagram 400B may be similar to the timing diagram 400A, except in the writing phase 440, the drive circuit 340 can be configured to provide a data signal having a negative voltage 490 (e.g., below 0V) to the bit lines BL, BLB. Thus, detailed description of duplicated portion thereof is omitted herein for the sake of brevity. In one example, the negative voltage control circuit 350 may be enabled in the writing phase 440 to provide a negative voltage 490 to the drive circuit 340, and the drive circuit 340 may generate the data signal based on or including the negative voltage 490. In one aspect, the negative voltage 490 can be applied to the memory cell 125 to improve a speed of writing operation.

Figure 5:
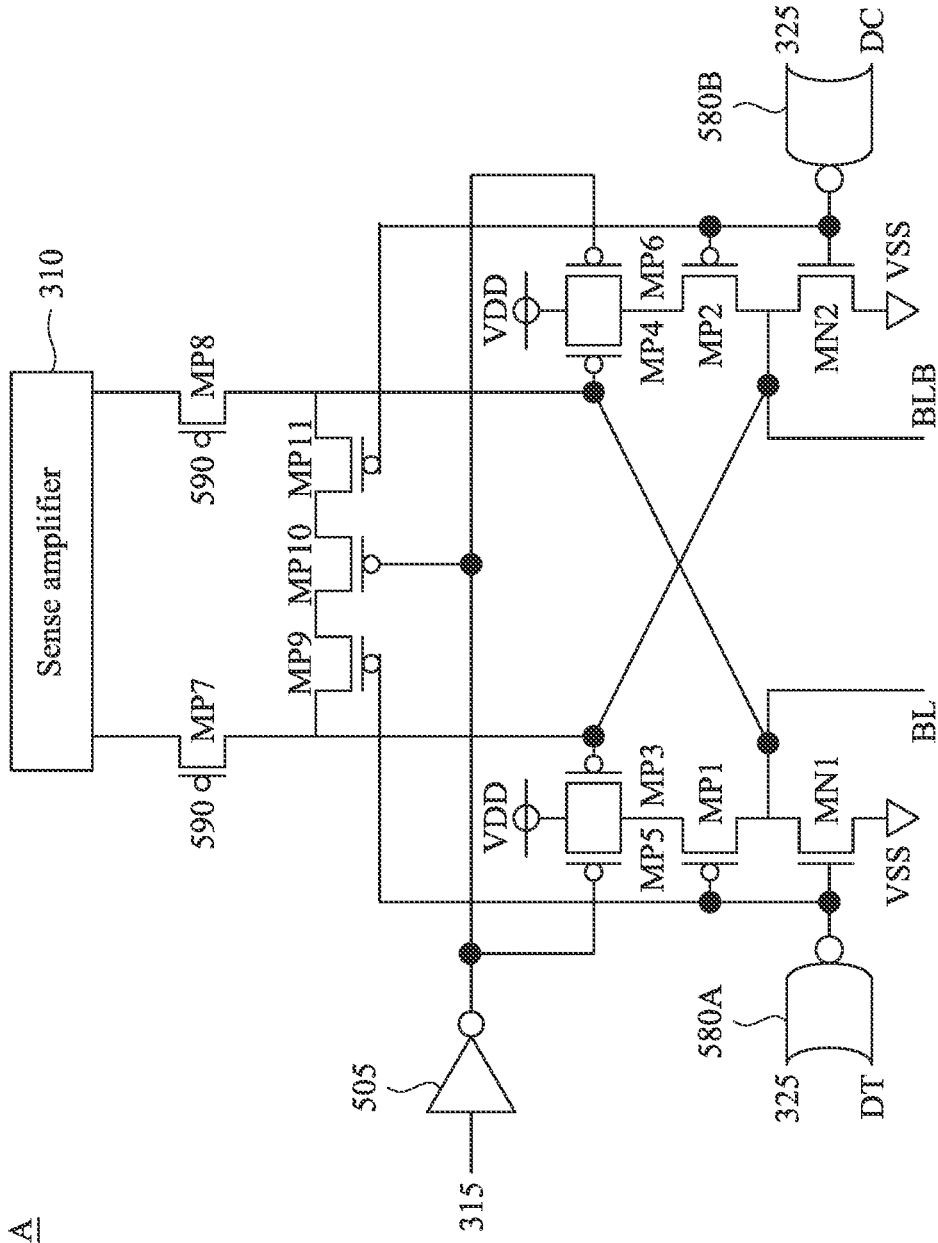
FIG. 5 is a diagram showing a bit line controller, in accordance with one embodiment.

FIG. 5 is a diagram showing a bit line controller 112A, in accordance with one embodiment. The bit line controller 112A may be the bit line controller 112 in FIG. 1 or FIG. 3. In some embodiments, the bit line controller 112A includes transistors MN1, MN2, MP1-MP11, an inverter 505, NOR gates 580A, 580B, and a sense amplifier 310. These components may operate together to apply data signals through bit lines BL, BLB to write data at a memory cell 125, or receive signals through bit lines BL, BLB to read data stored by the memory cell 125. In some embodiments, the transistors MN1, MN2 may be embodied as N-type transistors, and the transistors MP1-MP11 can be embodied as P-type transistors. In some embodiments, one or more of the transistors MN1, MN2, MP1-MP11 can be embodied as different types of transistors than shown in FIG. 5. In some embodiments, the bit line controller 112A includes more, fewer, or different components than shown in FIG. 5.

In some embodiments, the NOR gate 580A is a circuit that can perform a NOR operation on signals 325, DT. In some embodiments, the NOR gate 580A can be part of the control circuit 370. In some embodiments, the NOR gate 580A can be replaced by a different component that can perform the functions of the NOR gate 580A described herein. In one configuration, the NOR gate 580A includes i) a first input port to receive the write control signal 325 from the timing controller 110, ii) a second input port to receive an input signal DT from an external processor or a host processor (not shown), and iii) an output port. The input signal DT may correspond to or indicate a data to write at a memory cell 125. In this configuration, the NOR gate 580A may perform a NOR operation on the write control signal 325 and the input signal DT, and provide a result of the NOR operation at the output port.

In some embodiments, the NOR gate 580B is a circuit that can perform a NOR operation on signals 325, DC. In some embodiments, the NOR gate 580B can be part of the control circuit 370. In some embodiments, the NOR gate 580B can be replaced by a different component that can perform the functions of the NOR gate 580B described herein. In one configuration, the NOR gate 580B includes i) a first input port to receive the write control signal 325 from the timing controller 110, ii) a second input port to receive an input signal DC from an external processor or a host processor (not shown), and iii) an output port. The input signals DT, DC can be differential signals, such that the input signals DC, DT may have opposite phases with each other. In this configuration, the NOR gate 580B may perform a NOR operation on the write control signal 325 and the input signal DC, and provide a result of the NOR operation at the output port.

In some embodiments, the inverter 505 is a circuit that can invert a phase of the pre-charge control signal 315. In some embodiments, the inverter 505 can be part of the control circuit 370. In some embodiments, the inverter 505 can be replaced by a different component that can perform the functions of the inverter 505 described herein. In one configuration, the inverter 505 includes i) an input port to receive the pre-charge control signal 315 from the timing controller 110, and ii) an output port. In this configuration, the inverter 505 can generate a signal having an inverted phase of the pre-charge control signal 315, and provide the signal having the inverted phase at the output port.

In some embodiments, the transistors MN1, MN2, MP1-MP6 can constitute or operate as a drive circuit 340. In one configuration, the transistor MN1 includes i) a source electrode to receive a source voltage (e.g., VSS or 0V), ii) a gate electrode coupled to the output port of the NOR gate 580A, and iii) a drain electrode coupled to the bit line BL. In one configuration, the transistor MP3 includes i) a source electrode coupled to one or more metal rails providing a supply voltage (e.g., VDD or 1V), ii) a gate electrode coupled to the bit line BLB, and iii) a drain electrode coupled to a source electrode of the transistor MP1. In one configuration, the transistor MP1 includes i) a source electrode coupled to the drain electrode of the transistor MP3, ii) a gate electrode coupled to the output port of the NOR gate 580A, and iii) a drain electrode coupled to the bit line BL. The transistors MN2, MP2, MP4 can be arranged in a similar manner as the transistors MN1, MP1, MP3, respectively, except that i) drain electrodes of the transistors MN2, MP2 are coupled to the bit line BLB, ii) a gate electrode of the transistor MP4 is coupled to the bit line BL, and iii) gate electrode of the transistors MN2, MP2 are coupled to the output port of the NOR gate 580B. In this configuration, the drive circuit 340 can generate data signals representing or indicating data to write at a memory cell 125, according to the signals DT, DC and the write control signal 325. For example, in response to the write control signal 325 having the first voltage (e.g., VDD or 1V), the drive circuit 340 formed by the transistors MN1, MN2, MP1-MP6 can be disabled to not provide data signals to the bit lines BL, BLB. For example, in response to the write control signal 325 having the second voltage (e.g., VSS or 0V), the drive circuit 340 formed by the transistors MN1, MN2, MP1-MP6 can be enabled to provide data signals corresponding to the signals DT, DC to the bit lines BL, BLB.

In some embodiments, the transistors MP9, MP10, MP11 can constitute or operate as an equalizer 320. In one configuration, the transistors MP9, MP10, MP11 are coupled in series between the bit lines BL, BLB. In one configuration, a gate electrode of the transistor MP9 is coupled to the output port of the NOR gate 580A, and a gate electrode of the transistor MP11 is coupled to the output port of the NOR gate 580B. In one configuration, a gate electrode of the transistor MP10 is coupled to the output port of the inverter 505. In this configuration, the equalizer 320 formed by the transistors MP9, MP10, MP11 can be enabled, if the pre-charge control signal 315 has a first voltage (e.g., VDD or 1V) and the write control signal 325 has the first voltage (e.g., VDD or 1V). For example, if the pre-charge control signal 315 has a first voltage (e.g., VDD or 1V) and the write control signal 325 has the first voltage (e.g., VDD or 1V), the transistors MP9, MP10, MP11 can be all enabled to electrically couple the bit line BL to the bit line BLB. In this configuration, the equalizer 320 formed by the transistors MP9, MP10, MP11 can be disabled, if the pre-charge control signal 315 has a second voltage (e.g., VSS or 0V), or the write control signal 325 has the second voltage (e.g., VSS or 0V). For example, if the pre-charge control signal 315 has the second voltage (e.g., VSS or 0V), the transistor MP10 can be disabled to electrically decouple the bit line BL from the bit line BLB. For example, if the write control signal 325 has the second voltage (e.g., VSS or 0V), the transistor MP9 or the transistor MP11 can be disabled to electrically decouple the bit line BL from the bit line BLB.

In some embodiments, the transistors MP1, MP2, MP5, MP6 can constitute or operate as a pre-charge circuit 330. In one configuration, the transistor MP5 includes i) a source electrode coupled to one or more metal rails providing a supply voltage (e.g., VDD or 1V), ii) a gate electrode coupled to the output port of the inverter 505, and iii) a drain electrode coupled to the drain electrode of the transistor MP3. Hence, the transistors MP5 and MP3 can be coupled to each other in parallel between the one or more metal rails providing a supply voltage (e.g., VDD or 1V) and the transistor MP1. In one configuration, the transistor MP6 includes i) a source electrode coupled to one or more metal rails providing a supply voltage (e.g., VDD or 1V), ii) a gate electrode coupled to the output port of the inverter 505, and iii) a drain electrode coupled to the drain electrode of the transistor MP4. Hence, the transistors MP6 and MP4 can be coupled to each other in parallel between the one or more metal rails providing a supply voltage (e.g., VDD or 1V) and the transistor MP2. In this configuration, the pre-charge circuit 330 formed by the transistors MP1, MP2, MP5, MP6 can be enabled, if the pre-charge control signal 315 has a first voltage (e.g., VDD or 1V) and the write control signal 325 has the first voltage (e.g., VDD or 1V). For example, if the pre-charge control signal 315 has a first voltage (e.g., VDD or 1V) and the write control signal 325 has the first voltage (e.g., VDD or 1V), the transistors MP1, MP2, MP5, MP6 can be enabled to provide the first voltage (e.g., VDD or 1V) to the bit lines BL, BLB. In this configuration, the pre-charge circuit 330 formed by the transistors MP1, MP2, MP5, MP6 can be disabled, if the pre-charge control signal 315 has a second voltage (e.g., VSS or 0V), or the write control signal 325 has the second voltage (e.g., VSS or 0V). For example, if the pre-charge control signal 315 has a second voltage (e.g., VSS or 0V), the transistors MP5, MP6 can be disabled, such that the first voltage (e.g., VDD or 1V) may not be provided to the bit lines BL, BLB through the disabled transistors MP5, MP6. For example, if the write control signal 325 has a second voltage (e.g., VSS or 0V), the transistor MP1 or the transistor MP2 can be disabled, such that the first voltage (e.g., VDD or 1V) may not be provided to the bit line BL or the bit line BLB through the disabled transistor MP1 or MP2.

In some embodiments, the transistors MP7, MP8 can constitute or operate as a multiplexer 360. In one configuration, the transistor MP7 includes i) a source electrode coupled to the sense amplifier 310, ii) a gate electrode to receive a read control signal 590, and iii) a drain electrode coupled to the bit line BLB. The read control signal 590 may be provided by the timing controller 110. In one configuration, the transistor MP8 includes i) a source electrode coupled to the sense amplifier 310, ii) a gate electrode to receive a read control signal 590, and iii) a drain electrode coupled to the bit line BL. In this configuration, the transistors MP7, MP8 can operate as switches to selectively couple the bit lines BL, BLB to the sense amplifier 310, according to the read control signal 590. For example, in response to the read control signal 590 having the first voltage (e.g., VDD or 1V), the transistors MP7, MP8 can be disabled to electrically decouple the sense amplifier 310 from the bit lines BL, BLB. For example, in response to the read control signal 590 having the second voltage (e.g., VSS or 0V), the transistors MP7, MP8 can be enabled to electrically couple the sense amplifier 310 to the bit lines BL, BLB. In one aspect, the transistors MP7, MP8 can be enabled, when the drive circuit 340 formed by the transistors MN1, MN2, MP1, MP2, MP3, MP4 are disabled, such that a reading operation can be performed when a writing operation is not performed. In one aspect, the transistors MP7, MP8 can be disabled, when the drive circuits 340 formed by the transistors MN1, MN2, MP1, MP2, MP3, MP4 are enabled, such that a writing operation can be performed when a reading operation is not performed.

In one aspect, the pre-charge circuit 330 formed by the transistors MP1, MP2, MP5, MP6, and the equalizer 320 formed by the transistors MP9, MP10, MP11 can be automatically disabled, when the drive circuit 340 formed by the transistors MN1, MN2, MP1, MP2, MP3, MP4 is enabled in response to the write control signal 325 having the second voltage (e.g., VSS or 0V), irrespective of the pre-charge control signal 315. Accordingly, a large timing margin between the pre-charge control signal 315 and the write control signal 325, which is typically required in the existing memory devices to assure correct writing operation and avoid unintended current flow, can be obviated, such that the speed of writing data at the memory cell 125 can be improved.

Figure 6:
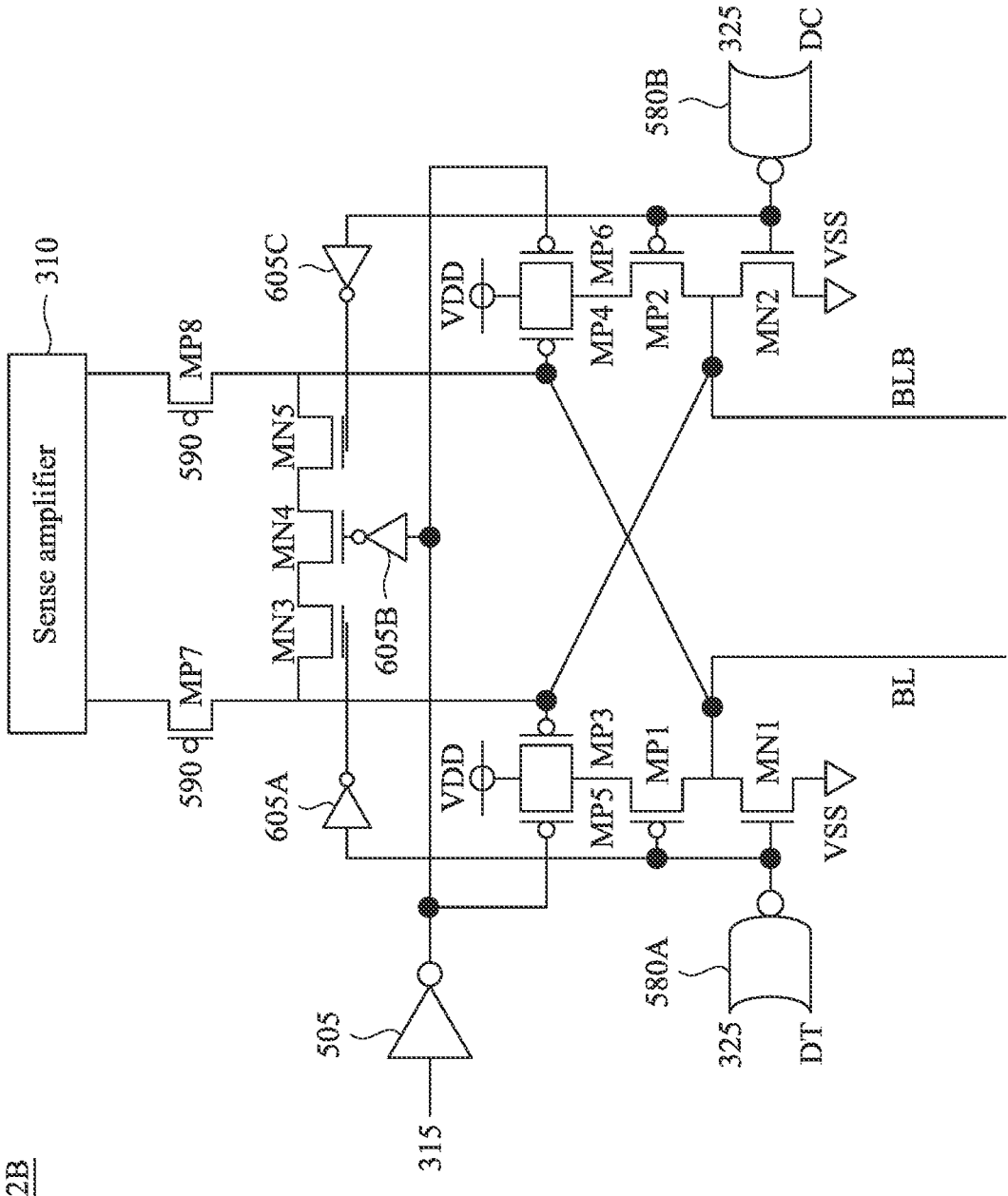
FIG. 6 is a diagram showing a bit line controller, in accordance with one embodiment.

FIG. 6 is a diagram showing a bit line controller 112B, in accordance with one embodiment. The bit line controller 112B can be the bit line controller 112 in FIG. 1 or FIG. 3. In one aspect, the bit line controller 112B is similar to the bit line controller 112A of FIG. 5, except the bit line controller 112B includes i) N-type transistors MN3, MN4, MN5 instead of P-type transistors MP9, MP10, MP11, and ii) inverters 605A, 605B, 605C. Each of the inverters 605A, 605B, 605C may be coupled between the output port of the inverter 505 and a gate electrode of a corresponding one of the transistors MN3, MN4, MN5. The inverters 605A, 605B, 605C and N-type transistors MN3, MN4, MN5 may operate in a similar manner as the P-type transistors MP9, MP10, MP11. Thus, detailed description of duplicated portion thereof is omitted herein for the sake of brevity.

Figure 7:
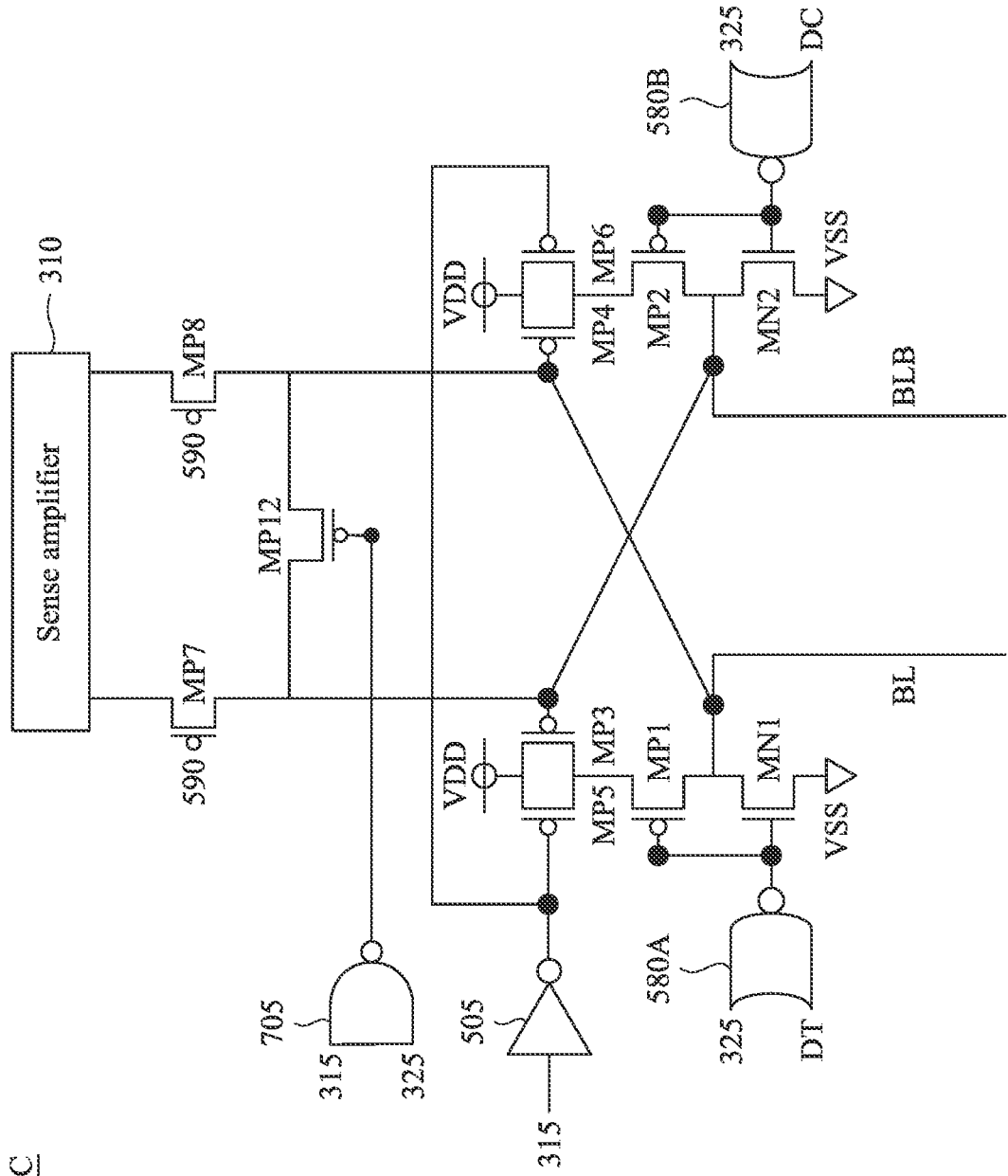
FIG. 7 is a diagram showing a bit line controller, in accordance with one embodiment.

FIG. 7 is a diagram showing a bit line controller 112C, in accordance with one embodiment. The bit line controller 112C can be the bit line controller 112 in FIG. 1 or FIG. 3. In one aspect, the bit line controller 112C is similar to the bit line controller 112A in FIG. 5, except that the bit line controller 112C includes a NAND gate 705 and a P-type transistor MP12 instead of the transistors MP9, MP10, MP11. Thus, detailed description of duplicated portion thereof is omitted herein for the sake of brevity.

In some embodiments, the NAND gate 705 is a circuit or a component that can perform a NAND operation on signals 315, 325. In some embodiments, the NAND gate 705 can be part of the control circuit 370. In some embodiments, the NAND gate 705 can be replaced by a different component that can perform the functions of the NAND gate 705 described herein. In one configuration, the NAND gate 705 includes i) a first input port to receive the pre-charge control signal 315, ii) a second input port to receive the write control signal 325, and iii) an output port. In this configuration, the NAND gate 705 can perform a NAND operation on the pre-charge control signal 315 and the write control signal 325, and provide a result of the NAND operation at the output port.

In some embodiments, the transistor MP12 is a circuit or a component to selectively couple the bit line BL to the bit line BLB. In some embodiments, the transistor MP12 can be implemented as a switch. The transistor MP12 can be a P-type transistor. In some embodiments, the transistor MP12 can constitute or operate as the equalizer 320. In some embodiments, the transistor MP12 can be replaced by a different component that can perform the functions of the transistor MP12 described herein. In some embodiments, the transistor MP12 includes a source electrode coupled to the bit line BL, a drain electrode coupled to the bit line BLB, and a gate electrode coupled to the output port of the NAND gate 705. In this configuration, the equalizer 320 formed by the transistor MP12 can be enabled to electrically couple the bit line BL to the bit line BLB, if the pre-charge control signal 315 has a first voltage (e.g., VDD or 1V) and the write control signal 325 has the first voltage (e.g., VDD or 1V). In this configuration, the equalizer 320 formed by the transistor MP12 can be disabled to electrically decouple the bit line BL from the bit line BLB, if the pre-charge control signal 315 has a second voltage (e.g., VSS or 0V), or the write control signal 325 has the second voltage (e.g., VSS or 0V).

Figure 8:
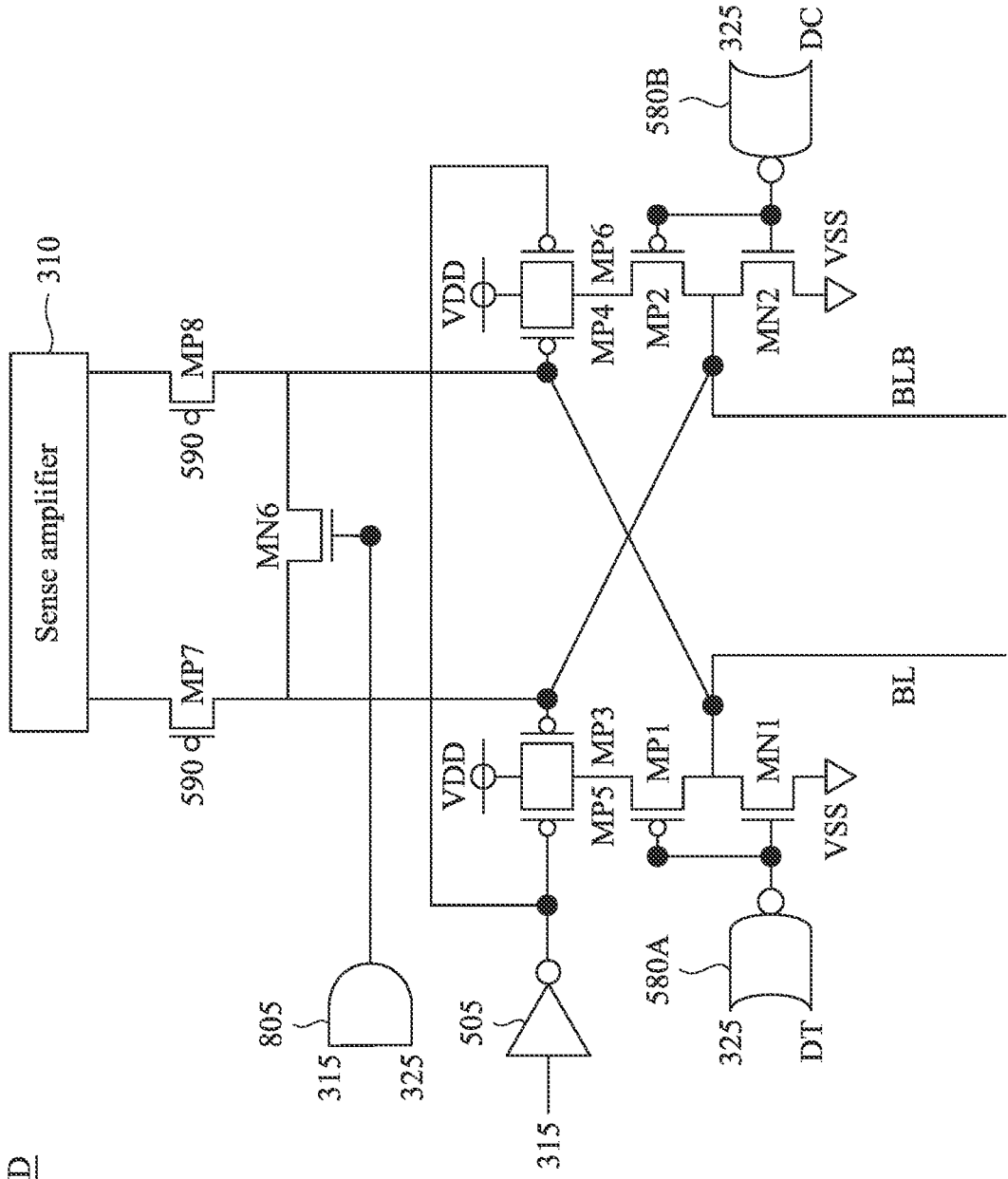
FIG. 8 is a diagram showing a bit line controller, in accordance with one embodiment.

FIG. 8 is a diagram showing a bit line controller 112D, in accordance with one embodiment. The bit line controller 112D can be the bit line controller 112 in FIG. 1 or FIG. 3. In one aspect, the bit line controller 112D is similar to the bit line controller 112C of FIG. 7, except the bit line controller 112D includes i) an N-type transistor MN6 instead of the P-type transistor MP12, and ii) an AND gate 805 instead of the NAND gate 705. The AND gate 805 may include i) a first input port to receive the pre-charge control signal 315, ii) a second input port to receive the write control signal 325, and iii) an output port. The transistor MN6 may include i) a source electrode coupled to the bit line BL, ii) a gate electrode coupled to the output port of the AND gate 805, and a drain electrode coupled to the bit line BLB. In this configuration, the AND gate 805 and the transistor MN6 may operate in a similar manner as the NAND gate 705 and the transistor MP12. Thus, detailed description of duplicated portion thereof is omitted herein for the sake of brevity.

Figure 9:
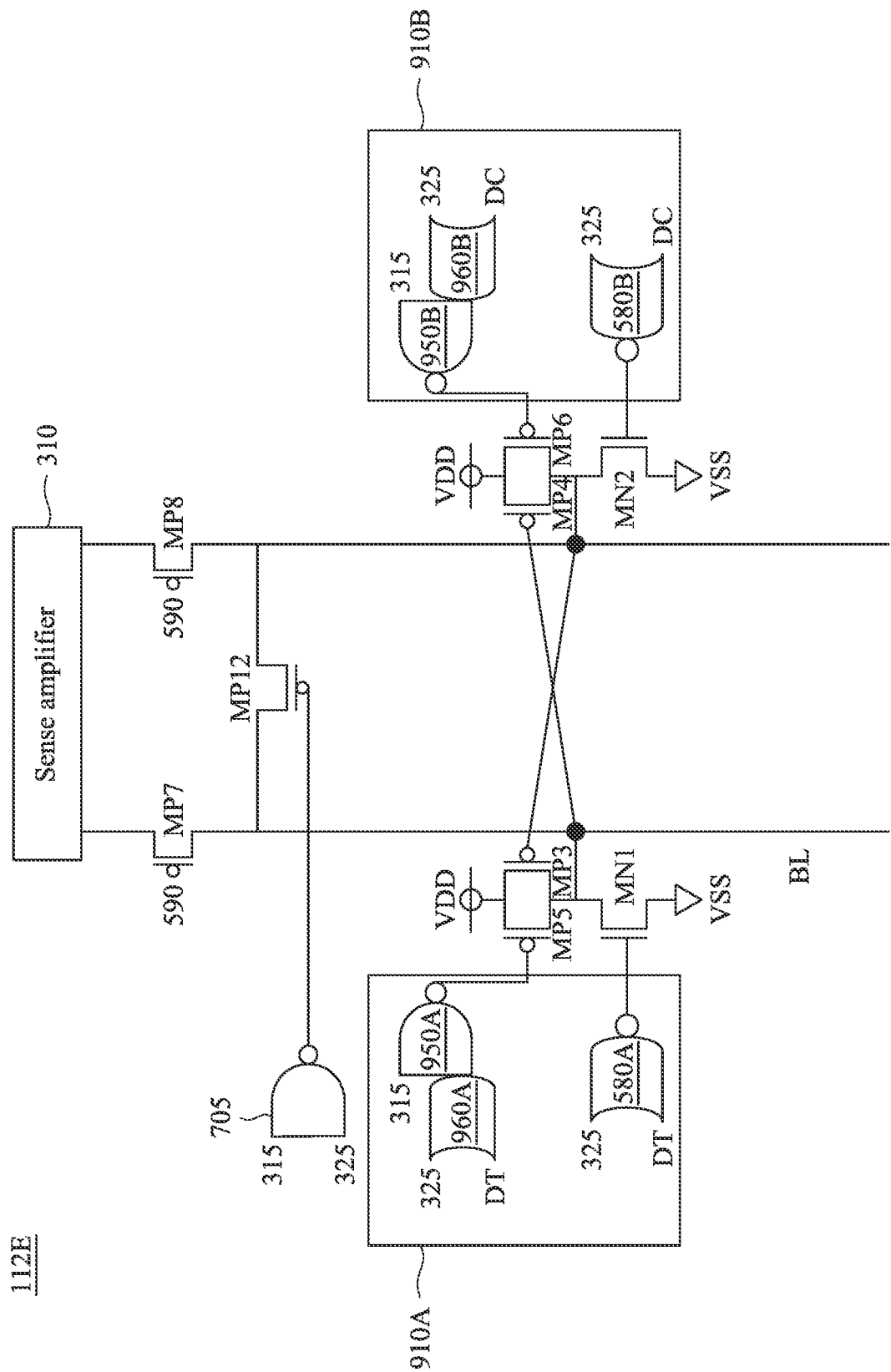
FIG. 9 is a diagram showing a bit line controller, in accordance with one embodiment.

FIG. 9 is a diagram showing a bit line controller 112E, in accordance with one embodiment. The bit line controller 112E can be the bit line controller 112 in FIG. 1 or FIG. 3. In one aspect, the bit line controller 112E is similar to the bit line controller 112C of FIG. 7, except the bit line controller 112E i) includes control circuits 910A, 910B, and ii) lacks the inverter 505 and the transistors MP1, MP2. In one configuration, drain electrodes of the transistors MP3, MP5 can be coupled to the bit line BL, and drain electrodes of the transistors MP4, MP6 can be coupled to the bit line BL. The NOR gates 580A can be implemented as part of the control circuit 910A, and the NOR gates 580B can be implemented as part of the control circuit 910B. Thus, detailed description of duplicated portion thereof is omitted herein for the sake of brevity.

In some embodiments, the control circuit 910A is a circuit or a component that can receive the signals 315, 325, DT, and process the signals 315, 325, DT to provide signals for configuring the transistors MN1, MP3, MP5. In some embodiments, the control circuit 910A can be part of the control circuit 370. In some embodiments, the control circuit 910A is embodied as logic circuits. In some embodiments, the control circuit 910A can be replaced by a different component that can perform the functions of the control circuit 910A disclosed herein.

In some embodiments, the control circuit 910A includes a NOR gate 580A, an OR gate 960A, and a NAND gate 950A. The NOR gate 580A can be arranged and operated, as described above with respect to FIG. 5. In one configuration, the OR gate 960A includes i) a first input port to receive the write control signal 325 from the timing controller 110, ii) a second input port to receive the input signal DT from the external processor, and iii) an output port. In one configuration, the NAND gate 950A includes i) a first input port to receive the pre-charge control signal 315 from the timing controller 110, ii) a second input port coupled to the output port of the OR gate 960A, and iii) an output port. In this configuration, if the pre-charge control signal 315 has a first voltage (e.g., VDD or 1V) and the write control signal 325 has the first voltage (e.g., VDD or 1V), the transistor MP5 can be enabled, such that the first voltage (e.g., VDD or 1V) may be provided to the bit lines BL. If the pre-charge control signal 315 has a second voltage (e.g., VSS or 0V), the transistor MP5 can be disabled, such that the first voltage (e.g., VDD or 1V) may not be provided to the bit line BL through the disabled transistor MP5. Similarly, if the write control signal 325 has the second voltage (e.g., VSS or 0V), the transistor MP5 can be disabled, such that the first voltage (e.g., VDD or 1V) may not be provided to the bit line BL through the disabled transistor MP5.

In some embodiments, the control circuit 910B is a circuit or a component that can receive the signals 315, 325, DC, and process the signals 315, 325, DC to provide signals for configuring the transistors MN2, MP4, MP6. In some embodiments, the control circuit 910B can be part of the control circuit 370. In some embodiments, the control circuit 910B is embodied as logic circuits. In some embodiments, the control circuit 910B can be replaced by a different component that can perform the functions of the control circuit 910B disclosed herein. In some embodiments, the control circuit 910B includes a NOR gate 580B, an OR gate 960B, and a NAND gate 950B. The NOR gate 580B can be arranged and operated, as described above with respect to FIG. 5. In addition, the OR gate 960B and the NAND gate 950B can be arranged in a similar manner as the OR gate 960A and the NAND gate 950A of the control circuit 910A, except that i) the OR gate 960B receives the input signal DC instead of the input signal DT and ii) the output port of the NAND gate 950B is coupled to the gate electrode of the transistor MP6. Hence, detailed description of duplicated portion thereof is omitted herein for the sake of brevity.

Figure 10:
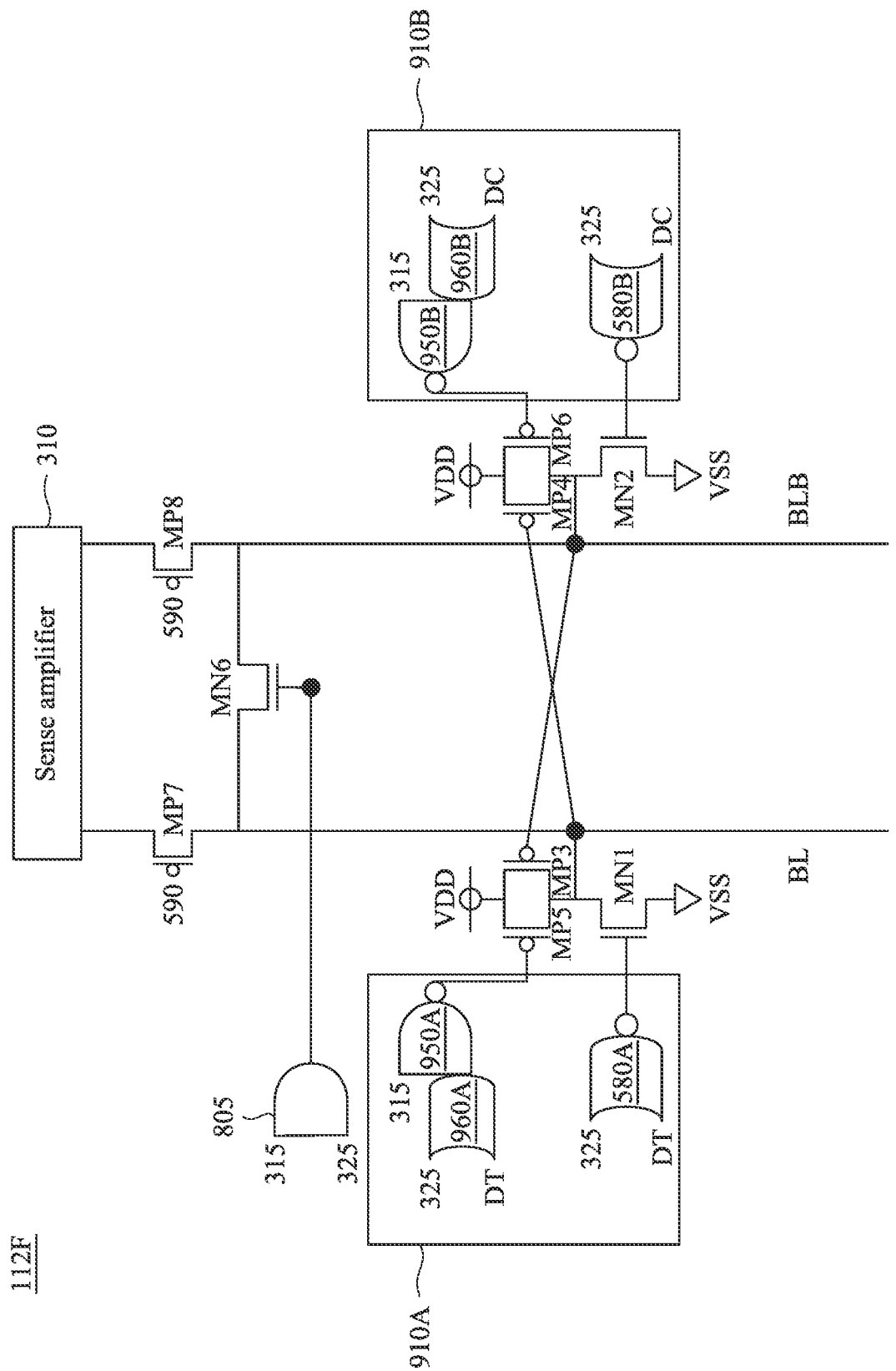
FIG. 10 is a diagram showing a bit line controller, in accordance with one embodiment.

FIG. 10 is a diagram showing a bit line controller 112F, in accordance with one embodiment. The bit line controller 112F can be the bit line controller 112 in FIG. 1 or FIG. 3. In one aspect, the bit line controller 112F is similar to the bit line controller 112E of FIG. 9, except the bit line controller 112F includes i) an N-type transistor MN6 instead of the P-type transistor MP12, and ii) an AND gate 805 instead of the NAND gate 705. The AND gate 805 and the transistor MN6 may be arranged, as described above with respect to FIG. 8. Thus, detailed description of duplicated portion thereof is omitted herein for the sake of brevity.

Figure 11:
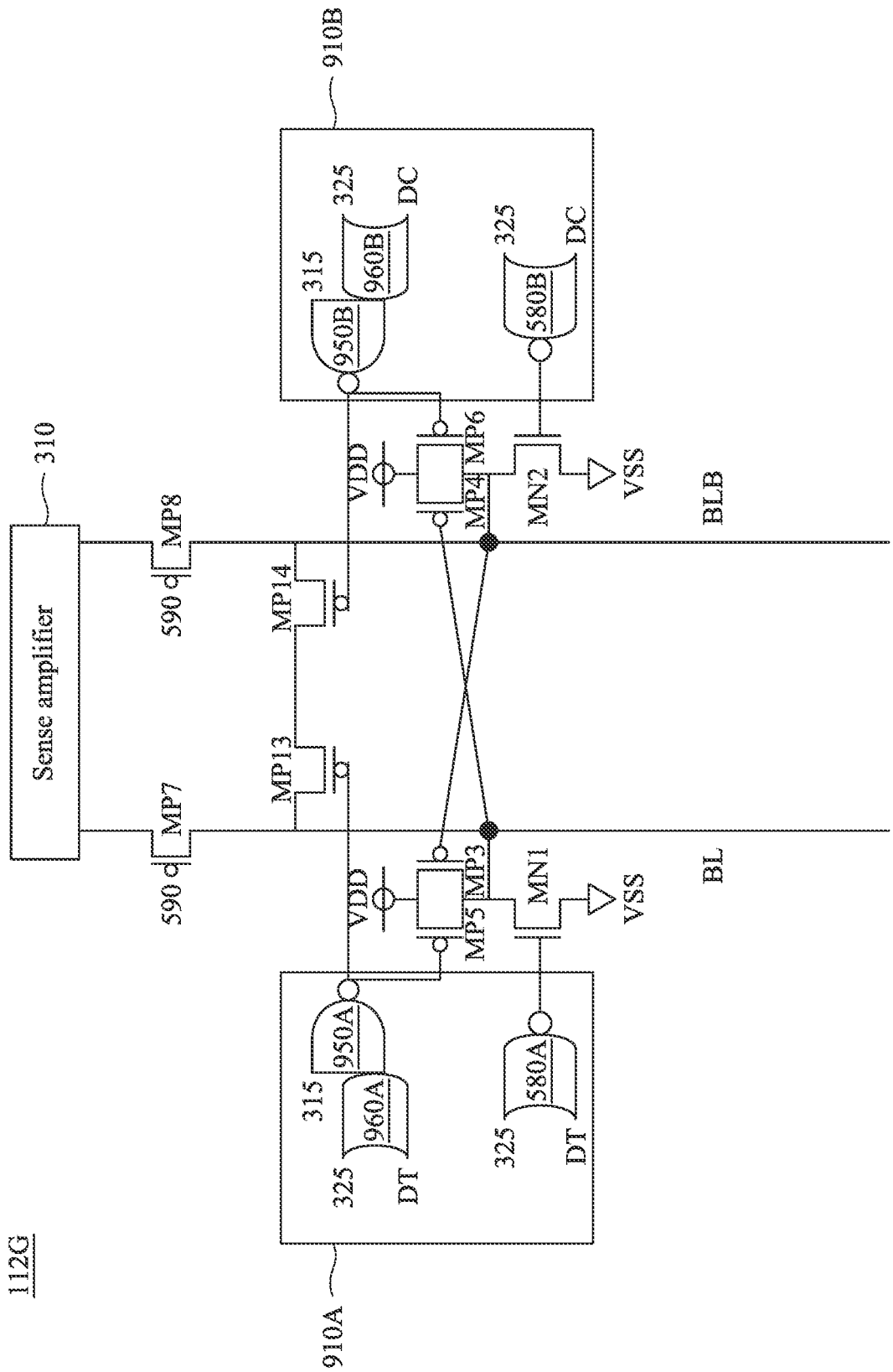
FIG. 11 is a diagram showing a bit line controller, in accordance with one embodiment.

FIG. 11 is a diagram showing a bit line controller 112G, in accordance with one embodiment. The bit line controller 112G can be the bit line controller 112 in FIG. 1 or FIG. 3. In one aspect, the bit line controller 112G is similar to the bit line controller 112E of FIG. 9, except the bit line controller 112G i) includes P-type transistors MP13, MP14 instead of the P-type transistor MP12, and ii) lack the NAND gate 705. Thus, detailed description of duplicated portion thereof is omitted herein for the sake of brevity.

In one aspect, the transistors MP13, MP14 can constitute or operate as an equalizer 320. In one configuration, the transistors MP13, MP14 are coupled in series between the bit lines BL, BLB. In one configuration, a gate electrode of the transistor MP13 is coupled to the output port of the NAND gate 950A, and a gate electrode of the transistor MP14 is coupled to the output port of the NAND gate 950B. In this configuration, the equalizer 320 formed by the transistors MP13, MP14 can be enabled, if the pre-charge control signal 315 has a first voltage (e.g., VDD or 1V) and the write control signal 325 has the first voltage (e.g., VDD or 1V). For example, if the pre-charge control signal 315 has a first voltage (e.g., VDD or 1V) and the write control signal 325 has the first voltage (e.g., VDD or 1V), the transistors MP13, MP14 can be all enabled to electrically couple the bit line BL to the bit line BLB. In this configuration, the equalizer 320 formed by the transistors MP13, MP14 can be disabled, if the pre-charge control signal 315 has a second voltage (e.g., VSS or 0V), or the write control signal 325 has the second voltage (e.g., VSS or 0V). For example, if the pre-charge control signal 315 has the second voltage (e.g., VSS or 0V), the transistors MP13, MP14 can be disabled to electrically decouple the bit line BL from the bit line BLB. For example, if the write control signal 325 has the second voltage (e.g., VSS or 0V), the transistor MP13 or the transistor MP14 can be disabled to electrically decouple the bit line BL from the bit line BLB.

Figure 12:
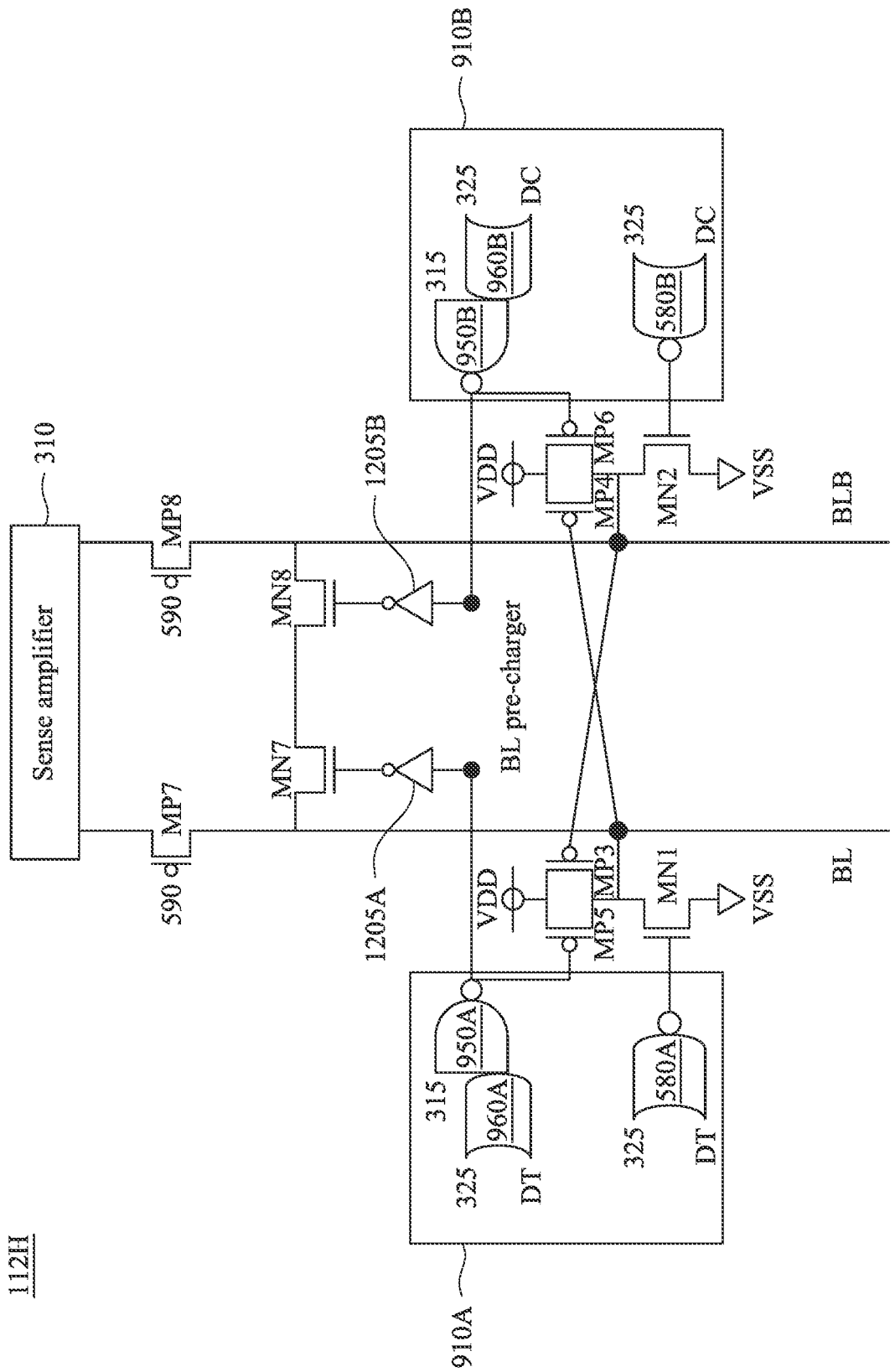
FIG. 12 is a diagram showing a bit line controller, in accordance with one embodiment.

FIG. 12 is a diagram showing a bit line controller 112H, in accordance with one embodiment. The bit line controller 112H can be the bit line controller 112 in FIG. 1 or FIG. 3. In one aspect, the bit line controller 112H is similar to the bit line controller 112G of FIG. 11, except the bit line controller 112H includes i) N-type transistors MN7, MN8 instead of the P-type transistors MP13, MP14, and ii) inverters 1205A, 1205B. The inverter 1205A may include i) an input port coupled to the output port of the NAND gate 950A, and ii) an output port coupled to a gate electrode of the transistor MN7. The inverter 1205B may include i) an input port coupled to the output port of the NAND gate 950B and ii) an output port coupled to a gate electrode of the transistor MN8. The inverters 1205A, 1205B and N-type transistors MN7, MN8 may operate in a similar manner as the P-type transistors MP13, MP14. Thus, detailed description of duplicated portion thereof is omitted herein for the sake of brevity.

Figure 13:
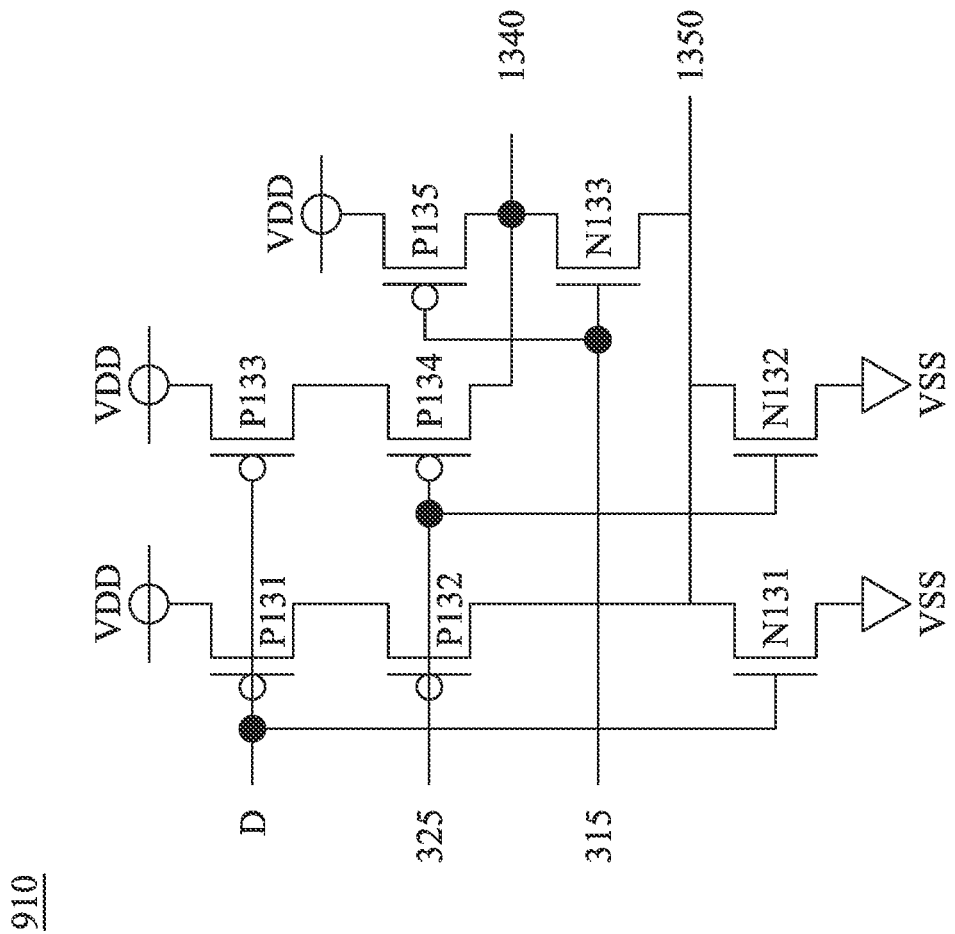
FIG. 13 is a diagram showing a control circuit to control timing of signals applied to an equalizer and a pre-charge circuit of a bit line controller, in accordance with one embodiment.

FIG. 13 is a diagram showing a control circuit 910 to control timing of signals applied to an equalizer 320 and a pre-charge circuit 330 of a bit line controller 112, in accordance with one embodiment. In some embodiments, the control circuit 910 may be the control circuit 910A or the control circuit 910B in FIGS. 9-12. In some embodiments, the control circuit 910 includes N-type transistors N131, N132, N133, and P-type transistors P131, P132, P133, P134, P135. These components may operate together to receive signals D, 325, 315, and generate signals 1340, 1350, according to the received signals D, 325, 315 to configure or operate the equalizer 320 and the pre-charge circuit 330. For the control circuit 910A (FIG. 9, 10, 11, or 12), the input signal D may be the input signal DT, the signal 1340 may be a signal at the output port of the NAND gate 950A, and the signal 1350 may be a signal at the output port of the NOR gate 580A. For the control circuit 910B (FIG. 9, 10, 11, or 12), the input signal D may be the input signal DC, the signal 1340 may be a signal at the output port of the NAND gate 950B, and the signal 1350 may be a signal at the output port of the NOR gate 580B. In some embodiments, the control circuit 910 includes more, fewer, or different components than shown in FIG. 13.

In some embodiments, the transistor N131 includes i) a source electrode to receive a source voltage (e.g., VSS or 0V), ii) a gate electrode to receive the input signal D, and iii) a drain electrode to provide a signal 1350. In some embodiments, the transistor P131 includes i) a source electrode coupled to one or more metal rails providing a supply voltage (e.g., VDD or 1V), ii) a gate electrode to receive the input signal D, and iii) a drain electrode coupled to a source electrode of the transistor P132. In some embodiments, the transistor P132 includes i) a source electrode coupled to the drain electrode of the transistor P131, ii) a gate electrode to receive the write control signal 325, and iii) a drain electrode coupled to the drain electrode of the transistor N131. In some embodiments, the transistor N132 includes i) a source electrode to receive a source voltage (e.g., VSS or 0V), ii) a gate electrode to receive the write control signal 325, and iii) a drain electrode coupled to the drain electrode of the transistor N131. In some embodiments, the transistor P133 includes i) a source electrode coupled to the one or more metal rails providing the supply voltage (e.g., VDD or 1V), ii) a gate electrode to receive the input signal D, and iii) a drain electrode coupled to a source electrode of the transistor P134. In some embodiments, the transistor P134 includes i) a source electrode coupled to the drain electrode of the transistor P133, ii) a gate electrode to receive the write control signal 325, and iii) a drain electrode to provide a signal 1340. In some embodiments, the transistor N133 includes i) a source electrode coupled to the drain electrode of the transistor N131, ii) a gate electrode to receive the pre-charge control signal 315, and iii) a drain electrode coupled to the drain electrode of the transistor P134. In some embodiments, the transistor P135 includes i) a source electrode coupled to the one or more metal rails providing the supply voltage VDD, ii) a gate electrode coupled to the gate electrode of the transistor N133, and iii) a drain electrode coupled to the drain electrode of the transistor N133. In this configuration, these components may operate together to perform logic operations of a NOR gate 580, OR gate 960, and NAND gate 950 of the control circuit 910 (FIG. 9, 10, 11, or 12). In one aspect, the control circuit 910 can implement eight transistors N131, N132, N133, P131, P132, P133, P134, P135, instead of twelve transistors for the NOR gate 580, OR gate 960, and NAND gate 950. Accordingly, the control circuit 910 can be implemented in a compact form to achieve area savings.

Figure 14:
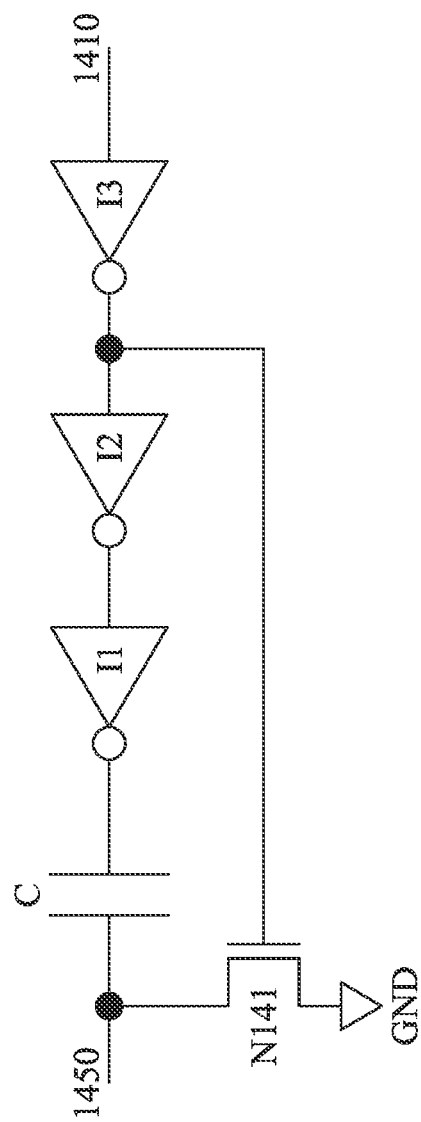
FIG. 14 is a diagram showing a negative voltage control circuit, in accordance with one embodiment.

FIG. 14 is a diagram showing a negative voltage control circuit 350 coupled to the BL and BLB described above, in accordance with one embodiment. In some embodiments, the negative voltage control circuit 350 includes inverters I1, I2, I3, a capacitor C, and an N-type transistor N141. These components may operate together to generate a negative voltage 1450, in response to a write assist control signal 1410. The write assist control signal 1410 may be provided by the timing controller 110. In some embodiments, the negative voltage control circuit 350 includes more, fewer, or different components than shown in FIG. 14.

In one configuration, the inverter I3 includes an input port to receive the write assist control signal 1410. In one configuration, the inverters I3, I2, I1 are cascaded. In one configuration, an output port of the inverter I1 is coupled to a first electrode of the capacitor C. In one configuration, the transistor N141 includes i) a source electrode coupled to one or more metal rails providing a ground voltage (e.g., GND or 0V), ii) a gate electrode coupled to the output port of the inverter I3, and iii) a drain electrode coupled to a second electrode of the capacitor C. In this configuration, the write assist control signal 1410 may have a pulse, and the capacitor C can store charges due to the pulse to generate a negative voltage at the second electrode of the capacitor C. For example, pulling up of the write assist control signal 1410 cuts off the transistor 141 and leaves both the coupled BL and BLB floating. With the capacitor C coupled to both the BL and BLB, the already floating BL, for example, can be pulled down to a negative voltage, while the other floating BLB, for example, may remain at high state.

In one aspect, the negative voltage 1450 generated by the negative voltage control circuit 350 can be provided as a source voltage VSS to the drive circuit 340 and or the control circuit 370. According to the negative voltage 1450, the drive circuit 340 can generate data signals based on or having the negative voltage 1450, for example, in the writing phase 440. The negative voltage 1450 may help improve the speed of writing operation.

Figure 15:
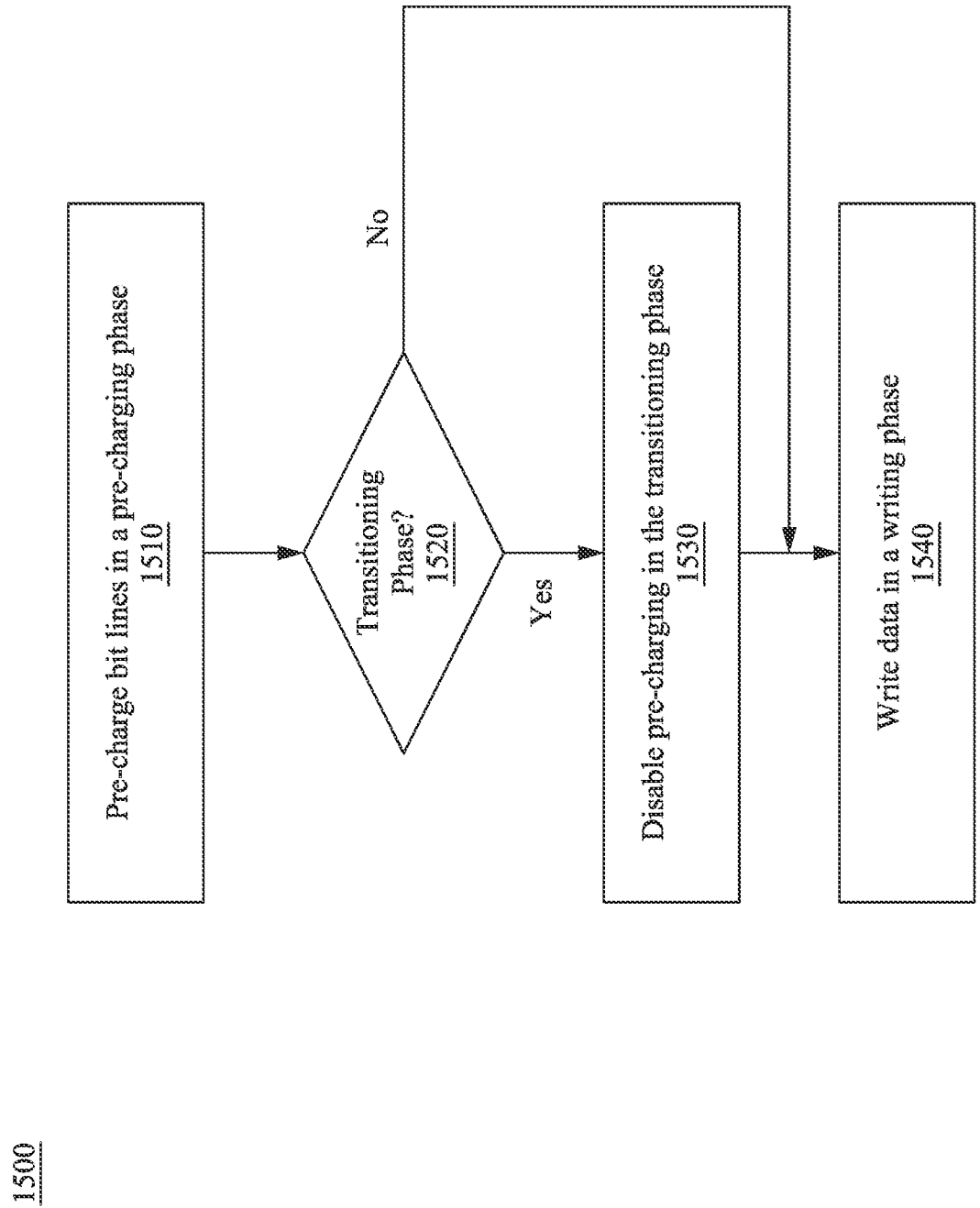
FIG. 15 is a flowchart showing a method of operating a memory device, in accordance with some embodiments.

FIG. 15 is a flowchart showing a method 1500 of operating a memory device (e.g., memory device 100), in accordance with some embodiments. In some embodiments, the method 1500 is performed by a controller (e.g., memory controller 105 or bit line controller 112). In some embodiments, the method 1500 is performed by other entities. In some embodiments, the method 1500 is performed to write data at a selected memory cell (e.g., memory cell 125). In some embodiments, the method 1500 includes more, fewer, or different steps than shown in FIG. 15. In some embodiments, the method 1500 can be performed in a different order than shown in FIG. 15.

In one approach, the controller determines whether the memory device 100 is operating in the pre-charging phase (e.g., pre-charging phase 430). In one approach, the controller receives a first control signal (e.g., write control signal 325), and a second control signal (e.g., pre-charge control signal 315), for example, from a timing controller (e.g., timing controller 110), and determine an operating phase of the memory device 100, according to the first control signal and the second control signal. The first control signal may be a write control signal 325 to enable or disable providing a data signal to a memory cell to write data at the memory cell 125. A data signal may be a signal corresponding to data to write at a memory cell 125. The second control signal may be a pre-charge control signal 315 to enable or disable pre-charging. In response to i) the first control signal (e.g., write control signal 325) having the first state (e.g., VDD or 1V), and ii) the second control signal (e.g., pre-charge control signal 315) having the second state (e.g., VDD or 1V), the controller may determine that the memory device 100 operates in the pre-charging phase.

In one approach, the controller pre-charges 1510 bit lines BL, BLB in the pre-charging phase (e.g., pre-charging phase 430). For example, the controller may enable an equalizer (e.g., equalizer 320) and a pre-charge circuit (e.g., pre-charge circuit 330), in response to i) a first control signal (e.g., write control signal 325) having a first state (e.g., VDD or 1V), and ii) a second control signal (e.g., pre-charge control signal 315) having a second state (e.g., VDD or 1V). By enabling the equalizer, bit lines BL, BLB may be electrically coupled to each other. By enabling the pre-charge circuit, voltages at the bit lines BL, BLB may be set or pre-charged to a predetermined voltage level (e.g., VDD or 1V). The controller may disable a drive circuit (e.g., drive circuit 340) in the pre-charging phase, in response to the first control signal (e.g., write control signal 325) having a first state (e.g., VDD or 1V). By disabling the drive circuit in the pre-charging phase while the equalizer 320 and the pre-charge circuit 330 are enabled, the drive circuit may not provide a data signal to bit lines BL, BLB. Accordingly, voltages at the bit lines BL, BLB can be set to a predetermined voltage level (e.g., VDD or 1V) in the pre-charging phase.

In one approach, the controller determines 1520 whether to provide a transitioning phase (e.g., transitioning phase 435). A transitioning phase can be provided optionally, when the second control signal (e.g., the pre-charge control signal 315) has the second state (e.g., VDD or 1V), and the first control signal (e.g., write control signal 325) has a third state (e.g., VSS or 0V) (or when the falling edge of the first control signal (e.g., write control signal 325) occurs before the falling edge of the second control signal (e.g., pre-charge control signal 315)). A transitioning phase may be omitted, when the second control signal (e.g., pre-charge control signal 315) has a fourth state (e.g., VSS or 0V), and the first control signal (e.g., the write control signal 325) has the first state (e.g., VDD or 1V) (or when the falling edge of the second control signal (e.g., the pre-charge control signal 315) occurs before the falling edge of the first control signal (e.g., the write control signal 325)).

In one approach, in response to determining to provide the transitioning phase, the controller may automatically disable 1530 the equalizer and the pre-charge circuit, in response i) to the first control signal (e.g., the write control signal 325) having the third state (e.g., VSS or 0V) and ii) the second control signal (e.g., the pre-charge control signal 315) having the second state (e.g., VDD or 1V). For example, the controller can implement a control circuit (e.g., control circuit 370) that can automatically decouple the equalizer and the pre-charge circuit from the bit line BL, BLB, in response to the first control signal having the third state (e.g., VSS or 0V), irrespective of the second control signal having the second state (e.g., VDD or 1V). By automatically disabling the equalizer and the pre-charge circuit, a current due to simultaneously enabling the equalizer, the pre-charge circuit, and the drive circuit can be obviated. Hence, a large timing margin between the first control signal and the second control signal can be reduced or omitted, to allow a faster operating speed of the memory device.

In one approach, in response to determining to bypass or omit the transitioning phase, the controller may proceed to the step 1540. For example, when the second control signal (e.g., pre-charge control signal 315) has a fourth state (e.g., VSS or 0V), and the first control signal (e.g., the write control signal 325) has the first state (e.g., VDD or 1V) (or when the falling edge of the second control signal (e.g., the pre-charge control signal 315) occurs before the falling edge of the first control signal (e.g., the write control signal 325)), the pre-charge circuit and the equalizer can be disabled, in response to the second control signal (e.g., pre-charge control signal 315) having the fourth state (e.g., VSS or 0V), such that the transitioning phase may be bypassed.

In one approach, the controller writes 1540 data in a writing phase (e.g., writing phase 440). For example, in response to i) the first control signal (e.g., write control signal 325) having the third state (e.g., VSS or 0V), and ii) the second control signal (e.g., pre-charge control signal 315) having the fourth state (e.g., VSS or 0V), the controller may determine that the memory device 100 operates in the writing phase. In the writing phase, the controller may disable the pre-charge circuit and the equalizer, in response to the second control signal (e.g., pre-charge control signal 315) having the fourth state (e.g., VSS or 0V). In addition, in the writing phase, the controller may enable the drive circuit, in response to the first control signal (e.g., write control signal 325) having the third state (e.g., VSS or 0V). The enabled drive circuit may apply data signals to one or more memory cells 125 through bit lines BL, BLB to write data at the one or more memory cells 125.

Figure 16:
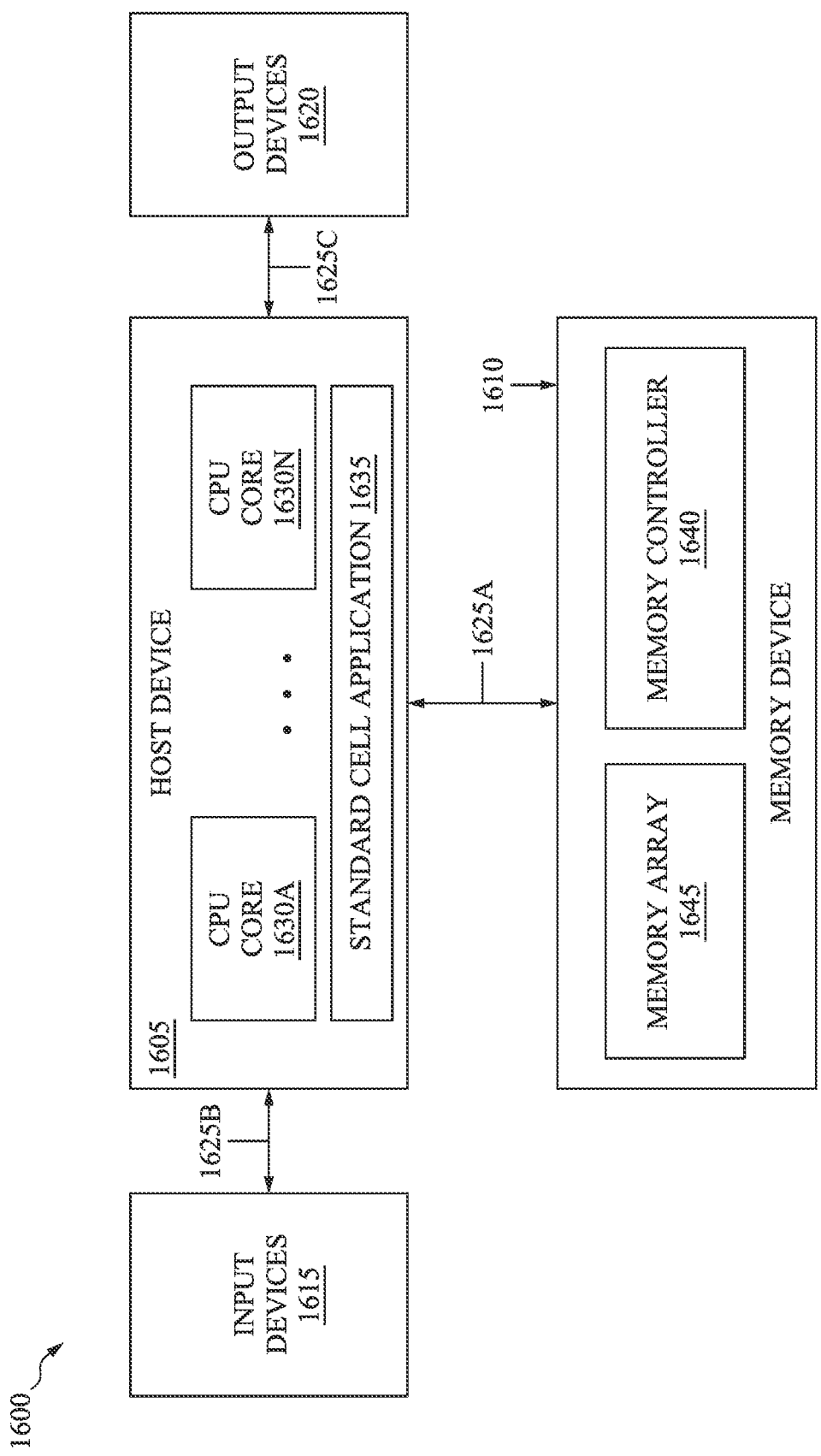
FIG. 16 is an example block diagram of a computing system, in accordance with some embodiments.

Referring now to FIG. 16, an example block diagram of a computing system 1600 is shown, in accordance with some embodiments of the disclosure. The computing system 1600 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1600 includes a host device 1605 associated with a memory device 1610. The host device 1605 may be configured to receive input from one or more input devices 1615 and provide output to one or more output devices 1620. The host device 1605 may be configured to communicate with the memory device 1610, the input devices 1615, and the output devices 1620 via appropriate interfaces 1625A, 1625B, and 1625C, respectively. The computing system 1600 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1605.

The input devices 1615 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1605 and that allows an external source, such as a user (e.g., a circuit or layout designer), to enter information (e.g., data) into the host device and send instructions to the host device. Similarly, the output devices 1620 may include a variety of output technologies such as external memories, printers, speakers, displays, microphones, light emitting diodes, headphones, video devices, and any other output peripherals that are configured to receive information (e.g., data) from the host device 1605. The "data" that is either input into the host device 1605 and/or output from the host device may include any of a variety of textual data, circuit data, signal data, semiconductor device data, graphical data, combinations thereof, or other types of analog and/or digital data that is suitable for processing using the computing system 1600.

The host device 1605 includes or is associated with one or more processing units/processors, such as Central Processing Unit ("CPU") cores 1630A ... 1630N. The CPU cores 1630A ... 1630N may be implemented as an Application Specific Integrated Circuit ("ASIC"), Field Programmable Gate Array ("FPGA"), or any other type of processing unit. Each of the CPU cores 1630A ... 1630N may be configured to execute instructions for running one or more applications of the host device 1605. In some embodiments, the instructions and data to run the one or more applications may be stored within the memory device 1610. The host device 1605 may also be configured to store the results of running the one or more applications within the memory device 1610. Thus, the host device 1605 may be configured to request the memory device 1610 to perform a variety of operations. For example, the host device 1605 may request the memory device 1610 to read data, write data, update or delete data, and/or perform management or other operations. One such application that the host device 1605 may be configured to run may be a standard cell application 1635. The standard cell application 1635 may be part of a computer aided design or electronic design automation software suite that may be used by a user of the host device 1605 to use, create, or modify a standard cell of a circuit. In some embodiments, the instructions to execute or run the standard cell application 1635 may be stored within the memory device 1610. The standard cell application 1635 may be executed by one or more of the CPU cores 1630A ... 1630N using the instructions associated with the standard cell application from the memory device 1610. In one example, the standard cell application 1635 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, or any portion of the memory device 100 can be fabricated according to the layout design by a fabrication facility.

Referring still to FIG. 16, the memory device 1610 includes a memory controller 1640 that is configured to read data from or write data to a memory array 1645. The memory array 1645 may include a variety of volatile and/or non-volatile memories. For example, in some embodiments, the memory array 1645 may include NAND flash memory cores. In other embodiments, the memory array 1645 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1645 may be individually and independently controlled by the memory controller 1640. In other words, the memory controller 1640 may be configured to communicate with each memory within the memory array 1645 individually and independently. By communicating with the memory array 1645, the memory controller 1640 may be configured to read data from or write data to the memory array in response to instructions received from the host device 1605. Although shown as being part of the memory device 1610, in some embodiments, the memory controller 1640 may be part of the host device 1605 or part of another component of the computing system 1600 and associated with the memory device 1610. The memory controller 1640 may be implemented as a logic circuit in either software, hardware, firmware, or combination thereof to perform the functions described herein. For example, in some embodiments, the memory controller 1640 may be configured to retrieve the instructions associated with the standard cell application 1635 stored in the memory array 1645 of the memory device 1610 upon receiving a request from the host device 1605.

It is to be understood that only some components of the computing system 1600 are shown and described in FIG. 16. However, the computing system 1600 may include other components such as various batteries and power sources, networking interfaces, routers, switches, external memory systems, controllers, etc. Generally speaking, the computing system 1600 may include any of a variety of hardware, software, and/or firmware components that are needed or considered desirable in performing the functions described herein. Similarly, the host device 1605, the input devices 1615, the output devices 1620, and the memory device 1610 including the memory controller 1640 and the memory array 1645 may include other hardware, software, and/or firmware components that are considered necessary or desirable in performing the functions described herein.

In one aspect of the present disclosure, a memory device is disclosed. In some embodiments, the memory device includes a memory cell. In some embodiments, the memory device includes a drive circuit coupled to a first line and a second line. In some embodiments, the drive circuit is configured to apply, according to a first control signal having a first state, a data signal to either one of the first line or the second line to write data at the memory cell. In some embodiments, the memory device includes a pre-charge circuit coupled to the first line and the second line. In some embodiments, the pre-charge circuit is configured to set, according to a second control signal having a second state and the first control signal having a third state, voltages at the first line and the second line to a predetermined voltage level. In some embodiments, the memory device includes an equalizer coupled between the first line and the second line. In some embodiments, the equalizer is configured to electrically couple the first line to the second line, according to the second control signal having the second state and the first control signal having the third state.

In another aspect of the present disclosure, a memory device is disclosed. In some embodiments, the memory device includes a memory cell coupled to a first bit line and a second bit line. In some embodiments, the memory device includes a drive circuit including a first transistor coupled between the first bit line and a first metal rail providing a first reference voltage. In some embodiments, the memory device includes a pre-charge circuit including a second transistor coupled between the first bit line and a second metal rail providing a second reference voltage. In some embodiments, the memory device includes a NOR gate including i) a first input to receive a first control signal, and ii) a second input to receive an input signal. In some embodiments, an output of the NOR gate is coupled to a gate electrode of the first transistor. In some embodiments, the memory device includes an OR gate including i) a first input to receive the first control signal, and ii) a second input to receive the input signal. In some embodiments, the memory device includes a NAND gate including i) a first input to receive a second control signal, and ii) a second input coupled to the output of the OR gate. In some embodiments, an output of the NAND gate is coupled to a gate electrode of the second transistor.

In yet another aspect of the present disclosure, a method of operating a memory device is disclosed. In some embodiments, the method includes pre-charging, by the memory device, a first bit line and a second bit line coupled to a memory cell, in response to a first control signal having a first state and a second control signal having a second state. The first control signal may indicate whether to apply a data signal to the memory cell to write data at the memory cell. The second control signal may indicate whether to pre-charge the first bit line and the second bit line. In some embodiments, the method includes determining, by the memory device, to provide a transitioning phase, according to the first control signal having a third state and the second control signal having the second state. In some embodiments, the method includes disabling, by the memory device, i) an equalizer to electrically decouple the first bit line from the second bit line, and ii) a pre-charge circuit to bypass setting a first voltage at the first bit line and a second voltage at the second bit line to a predetermined voltage level, in the transitioning phase. In some embodiments, the method includes enabling, by the memory device, a drive circuit to apply the data signal to the memory cell to write the data at the memory cell, while the equalizer and the pre-charge circuit are disabled, in response to the first control signal having the third state and the second control signal having a fourth state.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a memory cell;
   a drive circuit coupled to a first line and a second line, the drive circuit configured to apply, according to a first control signal having a first state, a data signal to either one of the first line or the second line to write data at the memory cell;
   a pre-charge circuit coupled to the first line and the second line, the pre-charge circuit configured to set, according to a second control signal having a second state and the first control signal having a third state, voltages at the first line and the second line to a predetermined voltage level; and
   an equalizer coupled between the first line and the second line, the equalizer configured to electrically couple the first line to the second line, based on a logic combination of the second control signal and the first control signal, where the second control signal has the second state and the first control signal has the third state.

2. The memory device of claim 1, wherein the drive circuit is to bypass, according to the first control signal having the third state, applying the data signal to the first line and the second line.

3. The memory device of claim 2, wherein the pre-charge circuit is to bypass, according to the second control signal having a fourth state or the first control signal having the first state, setting the voltages at the first line and the second line to the predetermined voltage level.

4. The memory device of claim 3, wherein the equalizer is configured to electrically decouple the first line from the second line, according to the second control signal having the fourth state or the first control signal having the first state.

5. The memory device of claim 4,
   wherein the equalizer includes a first transistor, a second transistor, and a third transistor coupled in series between the first line and the second line, wherein the second transistor is coupled between the first transistor and the third transistor, wherein either the first transistor or the third transistor is to electrically decouple the first line from the second line, according to the first control signal having the first state, and wherein the second transistor is to electrically decouple the first line from the second line, according to the second control signal having the fourth state.

6. The memory device of claim 5,
wherein the drive circuit includes:
   a fourth transistor and a fifth transistor coupled in series between the first line and one or more metal rails providing a reference voltage, and
   a sixth transistor and a seventh transistor coupled in series between the second line and the one or more metal rails providing the reference voltage, and
wherein the pre-charge circuit includes:
   an eighth transistor coupled to the fifth transistor in parallel between the fourth transistor and the one or more metal rails, and
   a ninth transistor coupled to the seventh transistor in parallel between the sixth transistor and the one or more metal rails.

7. The memory device of claim 4,
wherein the equalizer includes a first transistor coupled between the first line and the second line, wherein the first transistor is to:
   electrically decouple the first line from the second line, according to at least the first control signal having the first state or the second control signal having the fourth state, and
   electrically couple the first line to the second line, according to the first control signal having the third state and the second control signal having the second state.

8. The memory device of claim 7,
wherein the drive circuit includes:
   a second transistor and a third transistor coupled in series between the first line and one or more metal rails providing a reference voltage, and
   a fourth transistor and a fifth transistor coupled in series between the second line and the one or more metal rails providing the reference voltage, and
wherein the pre-charge circuit includes:
   a sixth transistor coupled to the third transistor in parallel between the second transistor and the one or more metal rails, and
   a seventh transistor coupled to the fifth transistor in parallel between the fourth transistor and the one or more metal rails.

9. The memory device of claim 7,
wherein the drive circuit includes:
   a second transistor coupled between the first line and one or more metal rails providing a reference voltage, and
   a third transistor coupled between the second line and the one or more metal rails providing the reference voltage, and
wherein the pre-charge circuit includes:
   a fourth transistor coupled to the second transistor in parallel between the first line and the one or more metal rails, and
   a fifth transistor coupled to the third transistor in parallel between the second line and the one or more metal rails.

10. The memory device of claim 9, further comprising:
a first OR gate including i) a first input to receive the first control signal, and ii) a second input to receive a first input signal corresponding to the data signal;
a first NAND gate including i) a first input to receive the second control signal, and ii) a second input coupled to an output of the first OR gate, an output of the first NAND gate coupled to a gate electrode of the fourth transistor;
a second OR gate including i) a first input to receive the first control signal, and ii) a second input to receive a second input signal having an opposite phase of the first input signal; and
a second NAND gate including i) a first input to receive the second control signal, and ii) a second input coupled to an output of the second OR gate, an output of the second NAND gate coupled to a gate electrode of the fifth transistor.

11. The memory device of claim 4,
wherein the equalizer includes a first transistor and a second transistor coupled in series between the first line and the second line,
wherein at least one of the first transistor or the second transistor is to electrically decouple the first line from the second line, according to at least the first control signal having the first state or the second control signal having the fourth state, and
wherein the first transistor and the second transistor are to electrically couple the first line to the second line, according to the first control signal having the third state and the second control signal having the second state.

12. The memory device of claim 11,
wherein the drive circuit includes:
   a third transistor coupled between the first line and one or more metal rails providing a reference voltage, and
   a fourth transistor coupled between the second line and the one or more metal rails providing the reference voltage, and
wherein the pre-charge circuit includes:
   a fifth transistor coupled to the third transistor in parallel between the first line and the one or more metal rails, and
   a sixth transistor coupled to the fourth transistor in parallel between the second line and the one or more metal rails.

13. The memory device of claim 12, further comprising:
a first OR gate including i) a first input to receive the first control signal, and ii) a second input to receive a first input signal corresponding to the data signal;
a first NAND gate including i) a first input to receive the second control signal, and ii) a second input coupled to an output of the first OR gate, an output of the first NAND gate coupled to a gate electrode of the first transistor and a gate electrode of the fifth transistor;
a second OR gate including i) a first input to receive the first control signal, and ii) a second input to receive a second input signal having an opposite phase of the first input signal; and
a second NAND gate including i) a first input to receive the second control signal, and ii) a second input coupled to an output of the second OR gate, an output of the second NAND gate coupled to a gate electrode of the second transistor and a gate electrode of the sixth transistor.

14. The memory device of claim 1, further comprising:
a sense amplifier coupled to the first line and the second line, the sense amplifier to read the data stored by the memory cell according to the voltages at the first line and the second line.

15. The memory device of claim 1, wherein the first line is a first bit line of the memory cell, and wherein the second line is a second bit line of the memory cell.

16. The memory device of claim 1, wherein the memory cell is coupled to a first bit line and a second bit line, the memory device further comprising:
another memory cell coupled to a third bit line and a fourth bit line; and
a multiplexer to:
selectively couple the first bit line or the third bit line to the first line, and
selectively couple the second bit line or the fourth bit line to the second line.

17. A memory device comprising:
a memory cell coupled to a first bit line and a second bit line;
a drive circuit including a first transistor coupled between the first bit line and a first metal rail providing a first reference voltage;
a pre-charge circuit including a second transistor coupled between the first bit line and a second metal rail providing a second reference voltage;
a NOR gate including i) a first input to receive a first control signal, and ii) a second input to receive an input signal, an output of the NOR gate coupled to a gate electrode of the first transistor;
an OR gate including i) a first input to receive the first control signal, and ii) a second input to receive the input signal; and
a NAND gate including i) a first input to receive a second control signal, and ii) a second input coupled to an output of the OR gate, an output of the NAND gate coupled to a gate electrode of the second transistor.

18. The memory device of claim 17, further comprising:
an equalizer including a third transistor and a fourth transistor coupled in series between the first bit line and the second bit line, an output of the NAND gate coupled to a gate electrode of the third transistor.

19. The memory device of claim 17, further comprising:
an equalizer including a third transistor coupled between the first bit line and the second bit line; and
another NAND gate including i) a first input to receive the first control signal and ii) a second input to receive the second control signal, an output of the another NAND gate coupled to a gate electrode of the third transistor.

20. A method comprising:
pre-charging, by a memory device, a first bit line and a second bit line coupled to a memory cell, in response to a first control signal having a first state and a second control signal having a second state, the first control signal indicating whether to apply a data signal to the memory cell to write data at the memory cell, the second control signal indicating whether to pre-charge the first bit line and the second bit line;
determining, by the memory device, to provide a transitioning phase, according to the first control signal having a third state and the second control signal having the second state;
disabling, by the memory device, i) an equalizer to electrically decouple the first bit line from the second bit line, and ii) a pre-charge circuit to bypass setting a first voltage at the first bit line and a second voltage at the second bit line to a predetermined voltage level, in the transitioning phase; and
enabling, by the memory device, a drive circuit to apply the data signal to the memory cell to write the data at the memory cell, while the equalizer and the pre-charge circuit are disabled, in response to the first control signal having the third state and the second control signal having a fourth state.

* * * * *